US007200365B2

(12) United States Patent
Watanabe et al.

(10) Patent No.: US 7,200,365 B2
(45) Date of Patent: Apr. 3, 2007

(54) COMPOSITE HIGH FREQUENCY COMPONENT AND MOBILE COMMUNICATION DEVICE INCLUDING THE SAME

(75) Inventors: Takahiro Watanabe, Shiga-ken (JP); Koji Tanaka, Shiga-ken (JP); Koji Furutani, Moriyama (JP); Hideki Muto, Omihachiman (JP); Takanori Uejima, Omihachiman (JP); Norio Nakajima, Takatsuki (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 482 days.

(21) Appl. No.: 10/441,218

(22) Filed: May 20, 2003

(65) Prior Publication Data

US 2003/0199271 A1 Oct. 23, 2003

Related U.S. Application Data

(62) Division of application No. 09/426,231, filed on Oct. 22, 1999, now Pat. No. 6,633,748.

(30) Foreign Application Priority Data

| Oct. 27, 1998 | (JP) | ................................. 10-305655 |
| Nov. 25, 1998 | (JP) | ................................. 10-334361 |
| Nov. 27, 1998 | (JP) | ................................. 10-337471 |
| Sep. 9, 1999 | (JP) | ................................. 11-255730 |

(51) Int. Cl.
*H04B 1/40* (2006.01)

(52) U.S. Cl. .............................. 455/82; 455/78; 455/73; 455/84; 455/452.2; 333/101; 333/102; 333/128; 333/129

(58) Field of Classification Search .................. 455/80, 455/82–84, 78, 73, 452.1, 452.2; 333/101, 333/102, 128, 129, 126, 100, 132, 134
See application file for complete search history.

(56) References Cited

U.S. PATENT DOCUMENTS 5,485,131 A 1/1996 Fajen et al.

(Continued)

FOREIGN PATENT DOCUMENTS

CA 2209597 1/1998

(Continued)

OTHER PUBLICATIONS

"A Small Sized High Efficiency Portable Telephone PHS Part" Jul. 23, 1998, Nikkan Kogyo Shimbun, pp. 25-29.

(Continued)

*Primary Examiner*—Edan Orgad
(74) *Attorney, Agent, or Firm*—Keating & Bennett, LLP

(57) ABSTRACT

The invention provides a composite high frequency component constituting a part of a microwave circuit having plural signal paths corresponding to their respective frequencies, comprising: a diplexer for coupling transmitting signals from the plural signal paths for transmission and distributing receiving signals into said plural signal paths for reception; plural high frequency switches for separating the plural signal paths into a transmission section and a reception section, respectively; plural filters introduced in the signal paths; said diplexer, said high frequency switch, and said filters being integrated into a ceramic multi-layer substrate formed by lamination of plural ceramic sheet layers. According to the above described composite high frequency component, the diplexer, the high frequency switches, and the filters which constitute the composite high frequency component are integrated into the ceramic multi-layer substrate formed by lamination of plural ceramic sheet layers. Thus, the matching and adjustment between the diplexer and the high frequency switches can be easily performed. It is unnecessary to provide a matching circuit for matching and adjusting the diplexer and the high frequency switches, and moreover, the high frequency switches and the filters.

10 Claims, 13 Drawing Sheets

U.S. PATENT DOCUMENTS

| | | |
|---|---|---|
| 5,499,000 A | 3/1996 | Morikawa et al. |
| 5,748,054 A | 5/1998 | Tonegawa et al. |
| 5,794,159 A | 8/1998 | Portin |
| 5,815,052 A | 9/1998 | Nakajima et al. |
| 5,818,313 A | 10/1998 | Estes et al. |
| 6,060,960 A | 5/2000 | Tanaka et al. |
| 6,147,571 A | 11/2000 | Kitazawa et al. |
| 6,185,434 B1 | 2/2001 | Hagstrom et al. |
| 6,366,564 B1 | 4/2002 | Hiraka et al. |
| 6,445,262 B1 | 9/2002 | Tamaka et al. |

FOREIGN PATENT DOCUMENTS

| | | |
|---|---|---|
| EP | 0 704 925 A1 | 4/1996 |
| EP | 0 785 590 A | 7/1997 |
| EP | 0 820 155 A2 | 1/1998 |
| JP | 1-103930 | 7/1989 |
| JP | 5-15542 | 2/1993 |
| JP | 6-188662 | 7/1994 |
| JP | 7-58659 | 3/1995 |
| JP | 07-58659 | 3/1995 |
| JP | 7-312568 | 11/1995 |
| JP | 8-18302 | 1/1996 |
| JP | 8-97743 | 4/1996 |
| JP | 8-162801 | 6/1996 |
| JP | 8-204622 | 8/1996 |
| JP | 9-130101 | 5/1997 |
| JP | 10-200442 | 8/1997 |
| JP | 9-284168 | 10/1997 |
| JP | 9-294042 | 11/1997 |
| JP | 10-32521 | 2/1998 |
| JP | 10-032521 | 2/1998 |
| JP | 10-56301 | 2/1998 |
| JP | 10-084583 | 3/1998 |
| JP | 10-107678 | 4/1998 |
| JP | 10-145270 | 5/1998 |
| JP | 10-200964 | 7/1998 |
| JP | 10-308602 | 11/1998 |
| JP | 11-225089 | 8/1999 |
| JP | 3304898 | 5/2002 |
| WO | WO 98/31109 | 7/1998 |

OTHER PUBLICATIONS

Bowick, RF Circuit Design, Newes, copyright 1982, pp. 13-17 and 44-66.

Tagami, et al. "Resonator Type SAW Filter" Apr. 1997, Oki Technical Review, No. 158, vol. 63.

Metz, "Duplexer Theory and Tuning" Feb. 6, 1998, South East Iowa Technical Society, p. 1.

Notice of Reasons for Revocation issued in a corresponding Japanese Patent Application, Dispatch No. 029864, Date of Dispatch: Apr. 22, 2003.

Nakai; "Laminated Ceramic Applied High-Frequency SMD Component"; the Hotline; Apr. 1998; vol. 27; pp. 5-10.

Official Communication issued in the corresponding European Application No. 06001136.8, mailed on Sep. 27, 2006.

COMPOSITE HIGH FREQUENCY COMPONENT AND MOBILE COMMUNICATION DEVICE INCLUDING THE SAME

This application is a Divisional of U.S. patent application Ser. No. 09/426,231 filed Oct. 22, 1999, now U.S. Pat. No. 6,633,748.

BACKGROUND OF THE INVENTION

1. Filed of the Invention

The present invention relates to a composite high frequency component and a mobile communication device including the same, and more particularly to a composite high frequency component which can be used in plural different mobile communication systems and a mobile communication device including the same.

2. Description of the Related Art

At present, in Europe, as a mobile communication device, a dual band portable telephone has been proposed which can be operated in plural frequency bands, for example, DCS (Digital Cellular System) employing the 1.8 GHz band, and GSM (Global System for Mobile Communications) operative in the 900 MHZ band.

FIG. 14 is a block diagram showing a part of the configuration of a dual band portable telephone as a conventional mobile communication device, illustrating an example of the combination of DCS in the 1.8 GHz band and GSM in the 900 MHZ band. The dual band portable telephone is equipped with an antenna 1, a diplexer 2, and two signal paths, namely, the DCS system 3 and the GSM system 4.

The diplexer 2, for transmission, performs the function of coupling transmitting signals from the DCS system 3 or GSM system 4, and for reception, does that of distributing received signals to the DCS system 3 or GSM system 4. The DCS system 3 is composed of a high frequency switch 3a for separating its transmission section Txd and its reception section Rxd, and a notch filter 3b for attenuating second and third harmonics of DCS. The GSM system 4 is composed of a high frequency switch 4a for separating its transmission section Txg and its reception section Rxg, and a notch filter 4b for attenuating third harmonics of GSM.

The high frequency switches 3a and 4a are separately provided with controlling power supplies Vc 61 and Vc 62 for on-off controlling the switches, respectively.

Hereinafter, the operation of the dual band portable telephone will be described in reference to the case that the DCS system 3 is used as an example. For transmission, with the high frequency switch 3a, the transmission section Txd is turned on, and a transmitting signal from the transmission section Txd is fed to the notch filter 3b. The transmitting signal, passed through the notch filter 3b. is wave-combined in the diplexer 2, and sent through the antenna 1. On the other hand, for reception, a receiving signal, received through the antenna 1, is wave-separated in the diplexer 2. The receiving signal form the antenna 1 is fed to the notch filter 3b. With the high frequency switch 3a, the reception section Rxd is turned on, so that the receiving signal is fed through the notch filter 3b to the reception section Rxd. In the case that the GSM system 4 is used, the transmission and reception are carried out by similar operation.

Further, in Europe, as a mobile communication device, a triple band portable telephone has also been proposed which can be operated in plural frequency bands, for example, by DCS (Digital Cellular System) and PCS (Personal Communication Services) which can be operated in the 1.8 GHz band, and GSM (Global System for Mobile Communications) operative in the 900 MHZ band.

FIG. 15 is a block diagram showing the front end portion of a conventional triple band portable telephone as an example. In this case, as the first and second communication systems operative at adjacent frequencies, DCS and PCS using the 1.8 GHz band, and also, as the third communication system applicable at a different frequency from the first and second communication systems, GSM operative in the 900 MHZ band are employed, respectively.

The front end portion of the triple band portable telephone is provided with an antenna 1a, a diplexer 2a, first through third high frequency switches 3a through 5a, and first and second filters 6a and 7a. The diplexer 2a has the function of coupling transmitting signals by DCS, PCS, or GSM in the case of transmitting, and distributing receiving signals to DCS, PCS, or GSM in the case of receiving. The first high frequency switch 3a switches the transmission section side of DCS and PCS to the reception section side of DCS and PCS and vice versa. The second high frequency switch 4a has the function of switching the reception section Rxd side of DCS to the reception section Rxp side of PCS and vice versa. The third high frequency switch 5a has the function of switching the transmission section Txg side of GSM to the reception section Rxg side thereof and vice versa. The first filter 6a has the function of passing transmitting—receiving signals by DCS and PCS and attenuating second and third harmonics, and the second filter 7a has the function of passing transmitting-receiving signals by GSM and attenuating the third harmonics.

Hereinafter, the operation of the triple band portable telephone, that is, first, the case of DSC will be described. In the case of transmission, with the first high frequency switch 3a, the transmission section Txdp common to that of PCS is turned on, so that a transmitting signal from the transmission section Txdp is fed to the first filter 6a. The transmitting signal passed through the first filter 6a is wave-associated in the diplexer 2a and sent through the antenna 1a. In the case of receiving, a receiving signal received through the antenna 1a is wave-separated in the diplexer 2a. The receiving signal from the antenna 1a is fed to the first filter 6a which is on the DCS and PCS side. With the first high frequency switch 3a, the reception section side is turned on so that the receiving signal passed through the first filter 6a is fed to the second high frequency switch 4a. With the second high frequency switch 4a, the reception section Rxd of DCS is turned on, so that the receiving signal passed through the second high frequency switch 4a is fed to the reception section Rxd of DCS. In the case of PCS used, the transmission and reception is performed by similar operation.

Thereafter, the case of GSM will be described. In the case of transmission, with the third high frequency switch 5a, the transmission section Txg is turned on so that a transmitting signal from the transmission section Txg is fed to the second filter 7a. The transmitting signal passed through the second filter 7a is wave-associated in the diplexer 2a and sent through the antenna 1a. In the case of receiving, a receiving signal received through the antenna 1a is wave-separated in the diplexer 2a. The receiving signal from the antenna 1a is fed to the second filter 7a which is on the GSM side. With the third high frequency switch 5a, the reception section Rxg is turned on, so that the receiving signal passed through the second filter 7a is fed to the reception section Rxg.

However, in the above-described dual band portable telephone which is one of conventional mobile communication devices, the antenna, the diplexer, and the high frequency switches and filters constituting the DCS system and the GSM system are discrete, and are mounted one by one on a circuit board. Accordingly, it is necessary to provide a matching circuit between the diplexer and the high frequency switches in order to assure the matching, the attenuation, or the isolation characteristics. For this reason, the number of the components is increased, causing the increase of the mounting area. As a result, it is necessary to employ a large circuit board. This causes the trouble that the dual band portable telephone (mobile communication device) is increased in size.

Further, in the above-described dual band portable telephone which is one of conventional mobile communication devices, the DCS system and the GSM system are on-off controlled by means of the two separate controlling power supplies only, connected separately to the transmission sides of the high frequency switches. Thus, during the transmission, the high frequency switches of the DCS system and the GSM system are differently operated, which causes the distortion problem with respect to the off-side high frequency switch. Furthermore, it is troublesome that the control of the high frequency switches for the transmission becomes complicate.

Further, in the above-described triple band portable telephone which is one of conventional mobile communication devices, the antenna, the diplexer, and also, the high frequency switches and the filters constituting the DCS system and GSM system are discrete, and mounted on one circuit board. Therefore. in order to assure the matching, the attenuation, and the isolation characteristics of the respective elements, it is necessary to provide a matching circuit between the diplexer and the high frequency switches. Accordingly, the number of the elements is risen, bringing the increase of the mounting area, and thereby, the large circuit board is needed. Thus, there is the problem that the size of the triple band portable telephone (mobile communication device) is large in size.

SUMMARY OF THE INVENTION

To overcome the above described problems, preferred embodiments of the present invention provide a composite high frequency component for which a matching circuit is unnecessary and of which the circuit can be miniaturized, and of which the distortion at transmission is inhibited, and the control of the transmission can be simplified, and a mobile communication device including the same.

One preferred embodiment of the present invention provides a composite high frequency component constituting a part of a microwave circuit having plural signal paths corresponding to their respective frequencies, comprising: a diplexer for coupling transmitting signals from the plural signal paths for transmission and distributing receiving signals into said plural signal paths for reception; plural high frequency switches for separating the plural signal paths into a transmission section and a reception section, respectively; plural filters introduced in the signal paths; said diplexer, said high frequency switch, and said filters being integrated into a ceramic multi-layer substrate formed by lamination of plural ceramic sheet layers.

According to the above described composite high frequency component, the diplexer, the high frequency switches, and the filters which constitute the composite high frequency component are integrated into the ceramic multi-layer substrate formed by lamination of plural ceramic sheet layers. Thus, the matching and adjustment between the diplexer and the high frequency switches can be easily performed. It is unnecessary to provide a matching circuit for matching and adjusting the diplexer and the high frequency switches, and moreover, the high frequency switches and the filters.

Accordingly, the number of the elements can be reduced, and thereby, the circuit board for forming the microwave circuit having the plural signal paths can be miniaturized.

In the above described composite high frequency component, the plural filters may be connected to the transmission section sides which are in the latter stage with respect to the high frequency switches.

According to the above described composite high frequency component, the filters are connected to the transmission section sides which are in the latter stage with respect to the high frequency switches, respectively. Thus, the distortion of the transmitting signal, caused by the high power amplifiers arranged in the transmission sections, can be attenuated. Thus, the insertion loss in the reception sections can be improved.

In the above described composite high frequency component, each of the plural filters may be a notch filter.

By using a notch filter, only the band area around the second and third harmonics can be attenuated to thereby the deleterious effect thereof on a band-area around the fundamental wave is reduced. Therefore, an insertion loss around the band-area including the fundamental wave is reduced more compared with a low-pass filter and a band-pass filter which attenuates whole of the high harmonics. Accordingly, the loss of the composite high frequency component is improved.

In the above described composite high frequency component, the diplexer may be composed of a first inductance element and a first capacitance element, each of the plural high frequency switches may be composed of a switching element, a second inductance element, and a second capacitance element, and each of the plural filters may be composed of a third inductance element and a third capacitance element, and the switching elements, the first through third inductance elements, and the first through third capacitance elements may be contained in or mounted onto the ceramic multi-layer substrate and connected by means of a connecting means formed inside the ceramic multi-layer substrate.

According to the above described composite high frequency component, the diplexer comprises the first inductance elements and the first capacitance elements, each of the high frequency switches does the switching elements, the second inductance elements, and the second capacitance elements, each of the filters does the third inductance element and the third capacitance elements, and moreover, they are contained in or mounted onto the ceramic multi-layer substrate and connected by means of a connecting means formed inside the ceramic multi-layer substrate. Thus, the composite high frequency component can be formed on one ceramic multi-layer substrate, and its miniaturization can be realized. In addition, the loss, caused by the wiring between the elements, can be improved. As a result, the overall loss of the composite high frequency component can be improved.

Further, the strip line electrodes to function as the inductors are contained in or mounted onto the ceramic multi-layer substrate. With the wave-length shortening effect, the lengths of the strip line electrodes to function as the respective inductance elements can be reduced. Therefore, the insertion loss caused by these strip-line electrodes can be enhanced. The miniaturization of the composite high frequency component and the reduction of the loss can be realized. As a result, the miniaturization and the high qualities of the mobile communication device including the composite high frequency component can be also attained.

In the above described composite high frequency component, the second inductance elements constituting the plural high frequency y switches may contain parallel trap coils and choke coils, and said parallel trap coils and said choke coils may be formed of chip coils.

According to the above described composite high frequency component, of the second inductance elements as the constituents of the plural high frequency switches, the choke coils and the parallel trap coils are chip coils. Therefore, the high frequency switches can be designed so as to have a low loss, and the band can be widened.

Another preferred embodiment of the present invention provides a mobile communication device including any one of the above described composite high frequency component.

The above described mobile communication device employs the composite high frequency component which is small in size and has a low loss. Therefore, the miniaturization and the high qualities of the mobile communication device including the high frequency switch can be attained.

Yet another preferred embodiment of the present invention provides a composite high frequency component constituting a part of a microwave circuit having plural signal paths corresponding to their respective frequencies, comprising: a diplexer for coupling transmitting signals from the plural signal paths for transmission and distributing receiving signals into said plural signal paths for reception; plural high frequency switches for separating the plural signal paths into a transmission section and a reception section, respectively; plural filters introduced in the signal paths; each of said plural high frequency switches including a first switching element connected to the transmission section side and a second switching element connected to the reception section side; and said plural high frequency switches being on-off controllable with a first common controlling power supply connected to the plural high frequency switches on the transmission section sides thereof.

According to the above described composite high frequency component, the plural high frequency switches are on-off controlled by means of the first common controlling power supply connected to the transmission section sides. Therefore, for transmission, the plural high frequency switches can be turned on at the same time, so that the higher harmonic distortion caused by the high frequency switches can be reduced, and the characteristics of the composite high frequency component can be enhanced.

Further, the control of the high frequency switches can be simplified. Thus, the transmission and reception by the mobile communication device including the composite high frequency component can be simply controlled.

Moreover, as the first controlling power supply, only one power supply is used. Thus, the wiring and arrangement on a substrate for mounting the composite high frequency component such as printed board can be simplified. Thus, the miniaturization of the mounting board can be realized. In addition, the mobile communication device including the composite high frequency component can be reduced in size.

Yet another preferred embodiment of the present invention provides a composite high frequency component constituting a part of a microwave circuit having plural signal paths corresponding to their respective frequencies, comprising: a diplexer for coupling transmitting signals from the plural signal paths for transmission and distributing receiving signals into said plural signal paths for reception; plural high frequency switches for separating the plural signal paths into a transmission section and a reception section, respectively; plural filters introduced in the signal paths; each of said plural high frequency switches including a first switching element connected to the transmission section side and a second switching element connected to the reception section side; said plural high frequency switches being on-off controllable with a first common controlling power supply connected to the plural high frequency switches on the transmission section sides thereof and a second common controlling power supply connected to the high frequency switches on the reception sides thereof.

According to the above described composite high frequency component, the plural high frequency switches are on-off controlled by means of the first common controlling power supply connected to the transmission section side and the second common controlling power supply connected to the reception section sides. Thus, for transmission, all the first and second diodes of the plural high frequency switches can be securely turned on, and the high frequency switches of the DCS and GSM systems can be securely turned on at the same time. Accordingly, the higher harmonic distortion during the transmission caused by the high frequency switches can be further reduced, and the characteristics of the composite high frequency component can be further enhanced.

As the first and second controlling power supplies, only one power supply is used, respectively. Thus, the wiring and arrangement on the substrate for mounting the composite high frequency component such as the printed board can be simplified, and the miniaturization of the substrate for mounting is realized. In addition, the mobile communication device including the composite high frequency component can be reduced in size.

In the above described composite high frequency component, the plural filters may be arranged between the plural high frequency switches and the transmission section sides, respectively.

According to the above described high frequency component, the filters each are arranged between the high frequency switches and the transmission section sides. Thus, the distortion of the transmitting signal, caused by the high power amplifiers arranged on the transmission section sides, can be decreased. Accordingly, the insertion loss on the reception sides can be improved.

In the above described composite high frequency component, the diplexer, the plural high frequency switches, and the filters may be integrated into a ceramic multi-layer substrate composed of plural ceramic sheet layers laminated together.

According to the above described composite high frequency component, the diplexer, the high frequency switches, and the filters which constitute the composite high frequency component are integrated into the ceramic multi-layer substrate formed by lamination of the plural ceramic sheet layers. Thus, the matching and adjustment between the diplexer and the high frequency switches can be easily performed. Accordingly, it is unnecessary to provide a matching circuit between the high frequency switches and the filters.

Accordingly, the number of the elements can be reduced, which enables the miniaturization of the circuit substrate on which the microwave circuit including plural signal paths is formed.

In the above described composite high frequency component, the diplexer may be composed of first inductance elements and first capacitance elements, each of the plural high frequency switches may be composed of the first switching element and the second switching element, second inductance elements, and second capacitance elements, and each of the plural filters may be composed of a third inductance element and third capacitance elements, and the first switching elements and the second switching elements, the first through third inductance elements, and the first through third capacitance elements may be contained in or mounted onto the ceramic multi-layer substrate and connected by means of a connecting means formed inside the ceramic multi-layer substrate.

According to the above described composite high frequency component, the diplexer is constituted by the first inductance elements and the first capacitance elements, each high frequency switch by the switching elements, the second inductance elements, and the second capacitance elements, and each filter by the third inductance elements and the third capacitance elements. Further, these elements are contained in or mounted onto the ceramic multi-layer substrate, and connected by means of a connecting means formed inside the ceramic multi-layer substrate. Thus, the composite high frequency component can be formed on one ceramic multi-layer substrate and can be miniaturized. In addition, the loss due to the wiring between the elements can be reduced. As a result, the overall loss of the composite high frequency component can be improved.

With the wave-length shortening effect, the lengths of the strip line electrodes as the respective inductance elements can be reduced. Therefore, the insertion loss caused by these strip-line electrodes can be enhanced. As a result, the miniaturization of the composite high frequency component and the reduction of the loss can be realized.

In the above described composite high frequency component, the second inductance element constituting each of the plural high frequency switches may be formed of a choke coil, and the choke coil is integrated into the ceramic multi-layer substrate.

According to the above described composite high frequency component, the choke coils and the parallel trap coils of the second inductance elements which constitute the plural high frequency switches are chip coils. Thus, the high frequency switches can be designed so as to have a low loss, and moreover, its band can be widened.

Yet another preferred embodiment of the present invention provides a mobile communication device including any one of the above described composite high frequency component.

According to the above described mobile communication device, the composite high frequency component which is small in size and has a less higher harmonic distortion is employed. Therefore, the miniaturization and the high performance of the mobile communication device including the composite high frequency component can be realized.

Yet another preferred embodiment of the present invention provides a composite high frequency component provided with a front end portion so formed as to correspond to first and second communication systems operative at adjacent frequencies, and a third communication system operative at a frequency different from those of the first and second communication systems, comprising: a diplexer for coupling transmitting signals from said first through third communication systems in the case of transmission and for distributing receiving signals to said first through third communication systems in the case of reception; a first high frequency switch for separating the transmission section of said first and second communication systems and the reception section of the first and second communication systems from each other; a second high frequency switch for separating the reception section of the first communication system and the reception section of the second communication system from each other; a third high frequency switch for separating the transmission section of said third communication system and the reception section thereof from each other; a first filter for passing transmission-reception signals of said first and second communication systems; and a second filter for passing transmission—reception signals of said third communication systems; and the composite high frequency component being integrated into a ceramic multi-layer substrate formed by lamination of plural ceramic sheet layers.

According to the above described composite high frequency component, the diplexer, the first through third high frequency switches, and the first and second filters, which constitute the composite high frequency component, are integrated into the ceramic multi-layer substrate formed by lamination of plural ceramic sheet layers, the matching, attenuation, or isolation characteristics can be assured. This makes it unnecessary to provide a matching circuit between the diplexer and the first and third high frequency switches.

Thus, the number of the elements can be reduced, which enables the miniaturization of the composite high frequency component which constitutes the front end portion corresponding to the first through third communication systems.

In the above described composite high frequency component, at least one of said first and second filters may be arranged in the post-stage with respect to the high frequency switch.

According to the above described composite high frequency component, the filters are arranged between the high frequency switches and the transmission sections. Thus, the distortion of a transmitting signal, caused by high power amplifiers formed in the transmission sections can be reduced. Accordingly, the insertion loss of the reception sections can be improved.

In the above described composite high frequency component, the diplexer may comprise a first inductance element and a first capacitance element, each of the first through third high frequency switches may comprise first and second switching elements, second inductance elements, and second capacitance elements, and each of the first and second filters may comprise a third inductance element and a third capacitance element; said first through third inductance elements, said first through third capacitance elements, and said first and second switching elements being contained in or mounted onto said ceramic multi-layer substrate and connected by a connecting means formed inside said ceramic multi-layer substrate.

According to the above described composite high frequency component, the diplexer comprises the first inductance elements and the first capacitance elements, the first through third high frequency switches do the first and second switching elements, the second inductance elements, and the second capacitance elements, respectively, the first and second filters do the third inductance elements and the third capacitance elements, respectively, and these elements are contained in or mounted onto the ceramic multi-layer substrate and connected by means of a connecting means formed inside the ceramic multi-layer substrate. Therefore, the composite high frequency component can be formed by use of one ceramic multi-layer substrate and further can be miniaturized. In addition, the loss caused by wirings between the elements can be improved. As a result, the overall loss of the composite high frequency component can be improved.

Further, with the wavelength shortening effects, the strip-line electrodes which function as the respective inductance elements can be shortened. Thus, the insertion losses due to these strip-line electrodes can be improved. As a result, the composite high frequency component can be miniaturized, and the reduction of the loss can be realized.

Yet another preferred embodiment of the present invention provides a mobile communication system including any one of the above described composite high frequency component.

The above described mobile communication device contains the composite high frequency component which is small in size and has a low loss. Accordingly, the mobile communication device having the composite high frequency component mounted thereto can be miniaturized and rendered high qualities.

Other features and advantages of the present invention will become apparent from the following description of the invention which refers to the accompanying drawings.

DESCRIPTION OF THE PREFERRED EMBODIMENTS

Figure 1:
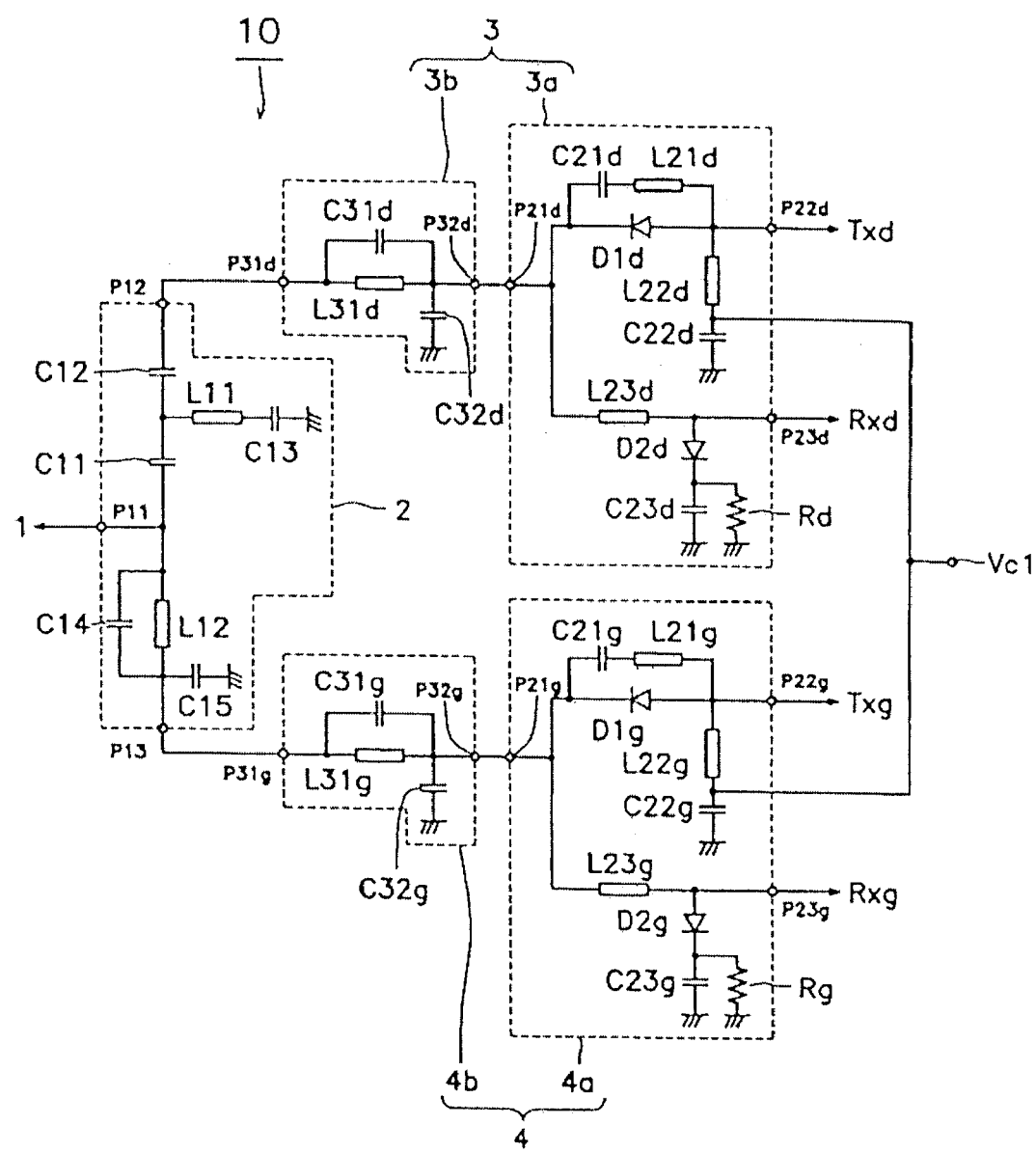
FIG. 1 is a circuit diagram of the composite high frequency component according to a first embodiment of the present invention.

FIG. 1 is a circuit diagram of a first embodiment of a composite high frequency component in accordance with the present invention. A composite high frequency component 10 is composed of the diplexer 2 and the high frequency switch 3a and the notch filter 3b which make up the DCS system 3, and the high frequency switch 4a and the notch filter 4b which constitute the GSM system 4.

The antenna 1 is connected to a first port P11 of the diplexer 2, a first port P31d of the notch filter 3b of the DCS system 3 to a second port P12, and a first port P31g of the notch filter 4b of the GSM system 4 to a third port P13, respectively.

In the DCS system 3, a first port P21d of the high frequency switch 3a is connected to a second port P32d of the notch filter 3b, the transmission section Txd to a second port P22d of the high frequency switch 3a, and the reception section Rxd to a third port P23d, respectively.

Further, in the GSM system 4, a first port P21g of the high frequency switch 4a is connected to a second port P32g of the notch filter 4b, the transmission section Txg to a second port P22g of the high frequency switch 4a, and the reception section Rxg to a third port P23g, respectively.

The diplexer 2 is composed of first inductors L11 and L12 which are first inductance elements, and first capacitors C11 through C15 which are first capacitance elements.

The first capacitors C11 and C12 are connected in series between the first port P11 and the second port P12, and their node is grounded through the first inductor L11 and the first capacitor C13.

A parallel circuit comprising the first inductor L12 and the first capacitor C14 is connected between the first port P11 and the third port P23. The parallel circuit on the third port P13 side is grounded through the first capacitor C15.

The high frequency switch 3a (4a) is composed of first and second diodes D1d and D2d (D1g and D2g) which are first and second switching elements, second inductors L21d through L23d (L21g through L23g) which are second inductance elements, and second capacitors C21d through C23d (C21g through C23g) which are second capacitance elements. The second inductor L21d (L21g) is a parallel trap coil, and a second inductor L22d (L22g) is a choke coil.

The first diode D1d (D1g) is so connected between the first port P21d (P21g) and the second port P22d (P22g) that its cathode is on the first port P21d (P21g) side. A series circuit comprising the second inductor L21d (L21g) and the second capacitor C21d (C21g) is connected in parallel to the first diode D1d (D1g).

The second port P22d (P22g) side of the first diode D1d (D1g), namely, its anode is grounded through the second inductor L22d (L22g) and the second capacitor C22d (C22g). A first common controlling power supply Vc1 for controlling the on-off of the high frequency switch 3a (4a) is connected to the node between the second inductor L22d (L22g) and the second capacitor C22d (C22g).

Further, the second inductor L23d (L23g) is connected between the first port P21d (P21g) and the third port P23d (P23g). The second inductor L23d (L23g) on the third port P23d (P23g) side is grounded through the second diode D2d (D2g) and the second capacitor C23d (C23g). The node between the anode of the second diode D2d (D2g) and the second capacitor C23d (C23g) is grounded through a resistor Rd (Rg).

The notch filter 3b (4b) is composed of a third inductor L31d (L31g) which is a third inductance element, and third capacitors C31d and C32d (C31g and C32g) which are third capacitance elements.

The third inductor L31d (L31g) is connected in series between the first port P31d (P31g) and the second port P32d (P32g). The third capacitor C31d (C31g) is connected in parallel to the third inductor L31d (L31g).

The third inductor L31d (L31g) on the second port P32d (P32g) side is grounded through the third capacitor C32d (C32g).

Hereinafter, the operation of the composite high frequency component 10 having the circuit arrangement of FIG. 1 will be described. First, if a transmitting signal of the DCS system 3 (1.8 GHz band) or that of the GSM system 4 (900 MHZ band) is transmitted, a controlling voltage 3V is applied from the first common controlling power supply Vc1 connected to the transmission section Txd side of the high frequency switch 3a of the DCS system 3 and the transmission section Txg side of the high frequency switch 4a of the GSM system 4, so that the first and second diodes D1d and D2d of the high frequency switch 3a of the DCS system 3, and the first and second diodes D1g and D2g of the high frequency switch 4a of the GSM system 4 are turned on, and thereby, a transmitting signal of the DCS system 3, passed through the high frequency switch 3a, the notch filter 3b, and the diplexer 2, or a transmitting signal of the GSM system 4, passed through the high frequency switch 4a, the notch filter 4b, and the diplexer 2, is sent through the antenna 1, respectively.

The transmitting signal from the DCS system 3 or the GSM system 4 is fed only to the antenna 1, not to the GSM system 4 or the DCS system 3, respectively, by means of the diplexer 2. Further, the second and third harmonics of the DCS system 3 are attenuated in the notch filter 3b of the DCS system 3, while the third harmonics of the GSM system 4 is done in the notch filter 4b of the GSM system 4.

In the case that receiving signals for the DCS system 3 and the GSM system 4 are received, a controlling voltage of 0V is applied from the first common controlling power supply Vc1 connected to the high frequency switch 3a of the DCS system 3 on the transmission section Txd, and the high frequency switch 4a of the GSM system 4 on the transmission section Txg, so that the first and second diodes D1d and D2d of the high frequency switch 3a of the DCS system 3 and the first and second diodes D1g and D2g of the high frequency switch 4a of the GSM system 4 are turned off, and thereby, the receiving signal for the DCS system 3 is given only to the reception section Rxd of the DCS system 3, while the receiving signal for the GSM system 4 only to the receiving section Rxg of the GSM system 4.

The diplexer 2 prevents the receiving signal for the DCS system 3 from being given to the GSM system 4 or one for the GSM system 4 from being applied to the DCS system 4.

Figure 2:
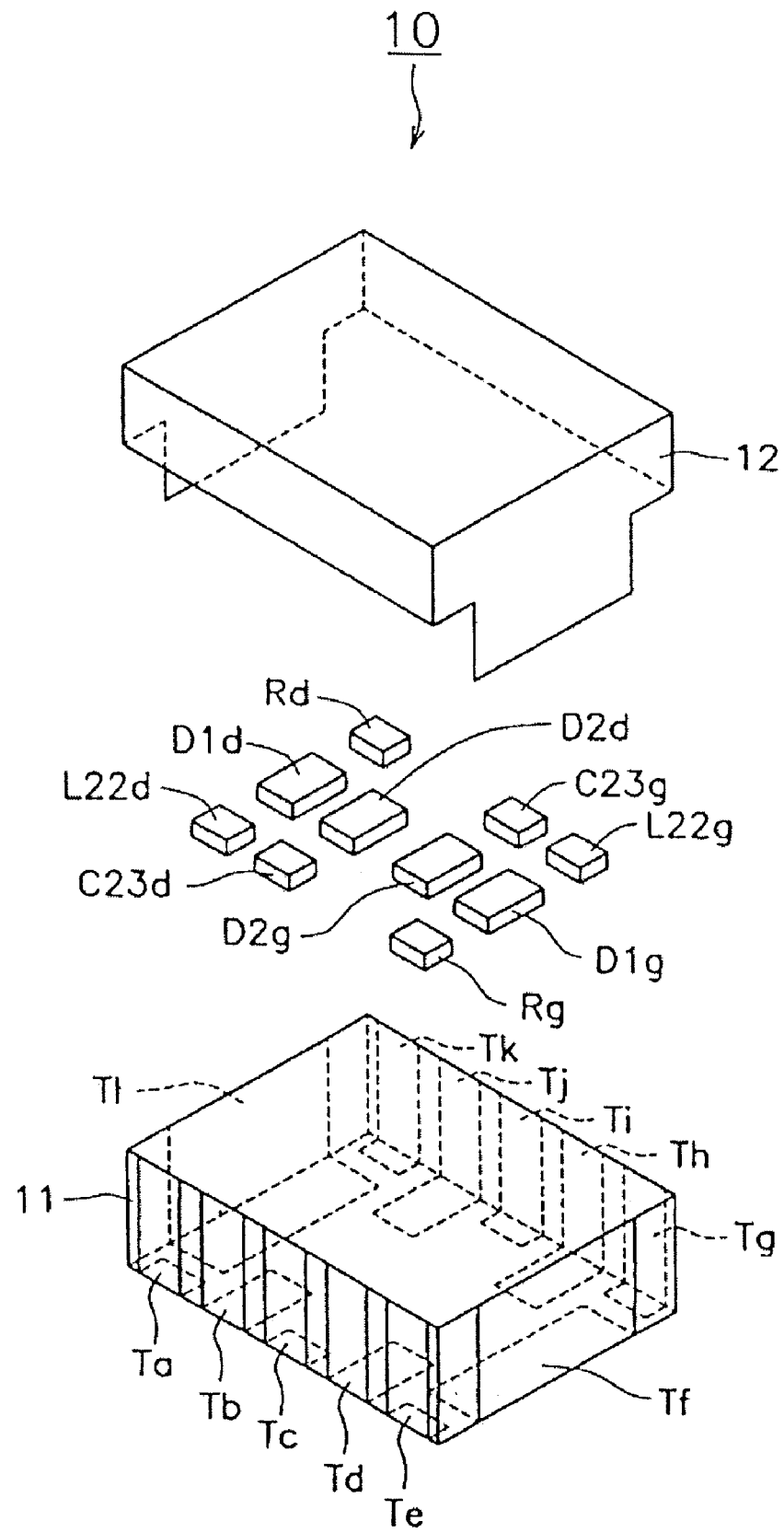
FIG. 2 is an exploded perspective view of an essential part of the composite high frequency component shown in FIG. 1.
Figure 3A:
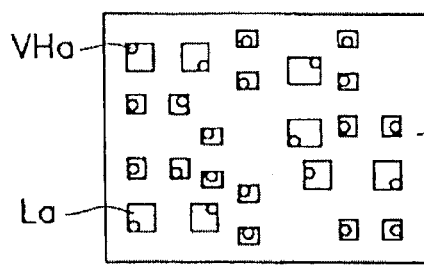
FIG. 3 is an upper side view of each of the first sheet layers (a) through the eighth sheet layers (h) which form the ceramic multi-layer substrate of the composite high frequency component of FIG. 2.
Figure 3B:
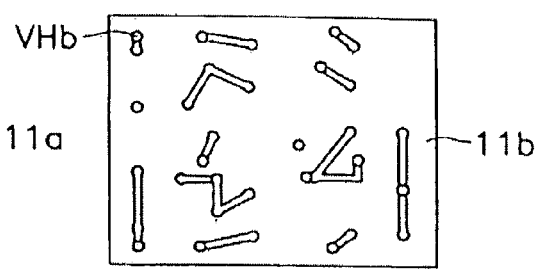
Figure 3C:
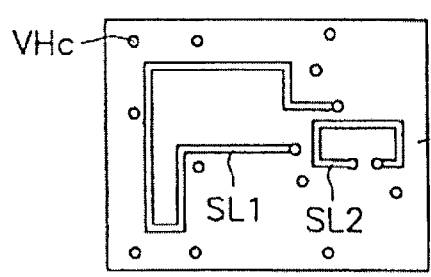
Figure 3D:
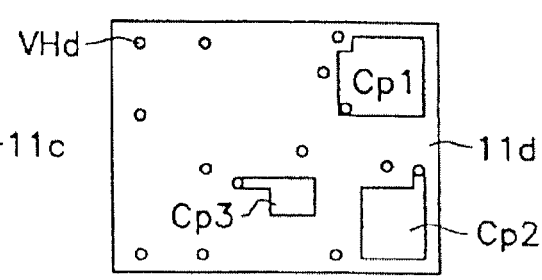
Figure 3E:
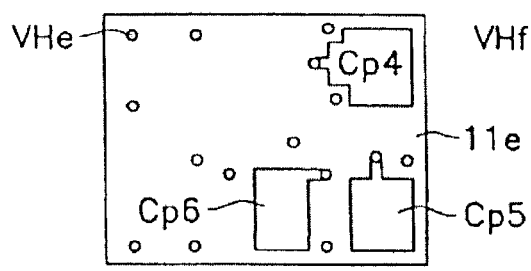
Figure 3F:
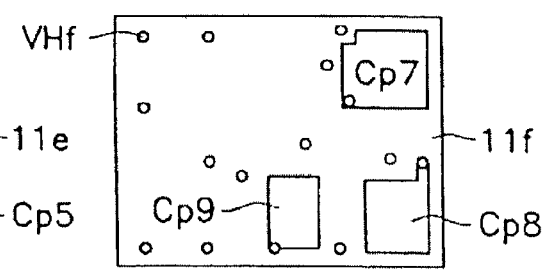
Figure 3G:
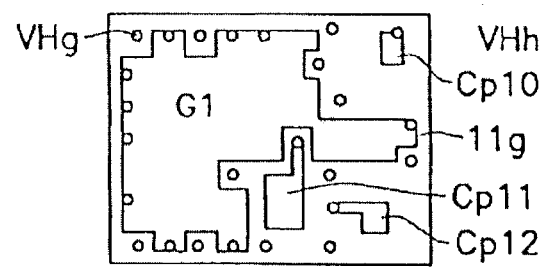
Figure 3H:
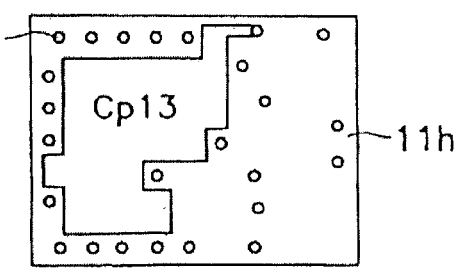
Figure 4A:
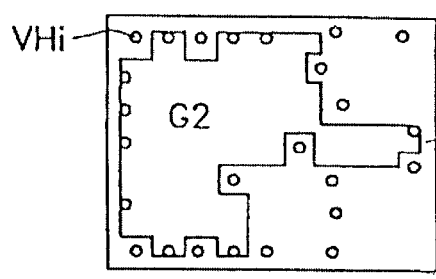
FIG. 4 consists of an upper side view of each of the ninth sheet layers (a) through the thirteenth sheet layers (e) and an lower side view of the thirteenth sheet (f) which form the ceramic multi-layer substrate of the composite high frequency component of FIG. 2.
Figure 4B:
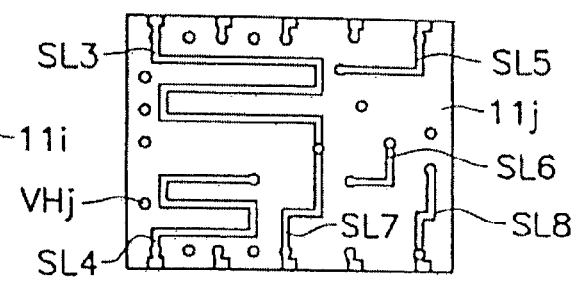
Figure 4C:
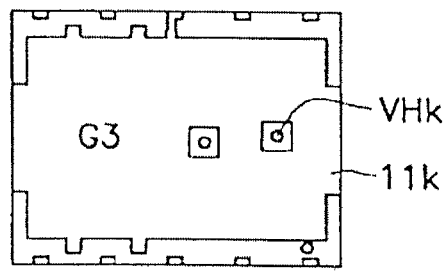
Figure 4D:
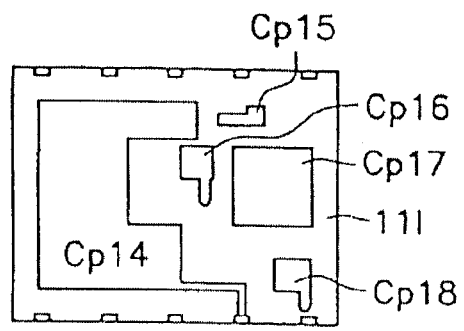
Figure 4E:
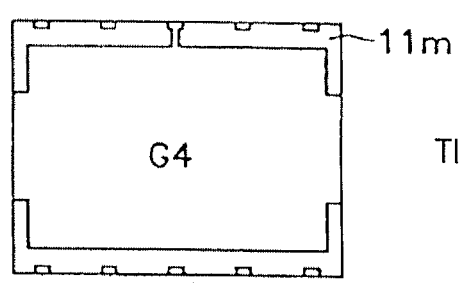
Figure 4F:
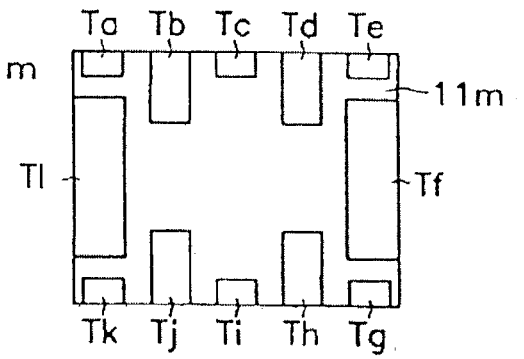

FIG. 2 is an exploded perspective view of the essential part of a composite high frequency component having the circuit arrangement of FIG. 1. The composite high frequency component 10 contains a ceramic multi-layer substrate 11. The ceramic multi-layer substrate 11, though not shown in the figure, contains the first inductors L11 and L12, and the first capacitors C11 through C15 which make up the diplexer 2, the second and third inductors L21d, L23d, and L31d, and the second and third capacitors C21d, C22d, C31d, and C32d which constitute the high frequency switch 3a and the notch filter 3b of the DCS system 3, and the second and third inductors L21g, L23g, and L31g, the second and third capacitors C21g, C22g, C31g, and C32g which constitute the high frequency switch 4a and notch filter 4b of the GSM system 4, respectively.

Further, on the surface of the ceramic multi-layer substrate 11, mounted are the first and second diodes D1d and D2d, the second inductor (choke coil) L22d, the second capacitor C23d, and the resistor Rd which constitute the high frequency switch 3a of the DCS system 3, and the first and second diodes D1g and D2g, the second inductor (choke coil) L22g, the second capacitor C23g, and a resistor Rg which make up the high frequency switch 4a of the GSM system 4.

Further, twelve external terminals Ta through Tl are so formed as to elongate from the side face onto the bottom of the ceramic multi-layer substrate 11 by screen printing or the like, respectively. The five external terminals Ta through Te of these external terminals Ta through Tl are formed on one long-side side of the ceramic multi-layer substrate 11, five external terminals Tg through Tk on the other long-side side of the ceramic multi-layer substrate 11, and the remaining two external terminals Tf and Tl on the opposite short-side sides of the ceramic multi-layer substrate 11, respectively, by screen printing or the like.

The external terminals Ta through Tl are used as the first port P11 of the diplexer 2, the second and third ports P22d, P23d, P22g, and P23g of the high frequency switches 3a and 3b, the terminals connected to the first controlling power supply Vc1 for the high frequency switches 3a and 3b, and the ground terminals.

The ceramic multi-layer substrate 11 is covered with a metallic cap 12 in such a manner as that the first and second diodes D1d, D1g, D2d, and D2g, the second inductors L22d and L22g, the second capacitors C23d and C23g, and the resistors Rd and Rg are coated.

FIGS. 3(a) through 3(h) and FIGS. 4(a) through 4(f) are the upper and lower side views of the respective sheet layers constituting the ceramic multi-layer substrate of the composite high frequency component of FIG. 2. The ceramic multi-layer substrate 11 is formed by laminating the first through thirteenth sheet layers 11a through 11m made of a ceramic containing as a major component barium oxide, aluminum oxide, and silica, in that order from the uppermost side, and firing the laminate at a firing temperature of up to 1000° C.

Then, on the upper side of the first sheet layer 11a, by screen printing, formed are lands La for mounting the first and second diodes D1d, D1g, D2d, and D2g, the second inductors L22d and L22g, the second capacitor C23d and C23g, and the resistors Rd and Rg which are to be mounted on the surface of the ceramic multi-layer substrate 11.

On the upper sides of the third and tenth sheet layers 11c and 11j, strip line electrodes SL1 through SL8 made of conductor layers are formed by screen printing or the like. Further, on the upper sides of the fourth through eighth and twelfth sheet layers 11d through 11h and 11l, capacitor electrodes Cp1 through Cp18 made of conductor layers are formed by screen printing or the like.

In addition, on the upper sides of the seventh, ninth, eleventh and thirteenth sheet layers 11g, 11i, 11k, and 11m, ground electrodes G1 through G4 made of conductor layers are formed by screen printing or the like. Further, on the lower side of the thirteenth sheet layer 11m (FIG. 4(f)), the external terminals Ta through Tl are formed by screen printing or the like.

For the first through eleventh sheet layers 11a through 11k in their predetermined positions, provided are via holes electrodes VHa through VHk for connecting the lands La, the strip line electrodes SL1 through SL8, the strip line electrodes SL1 through SL8, and the ground electrodes G1 through G4.

In this case, the first inductors L11 and L12 of the diplexer 2 are formed with the strip line electrodes SL6 and SL7. Further, the second inductors L21d and L23d of the high frequency switch 3a of the DCS system 3 are formed with the strip line electrodes SL2 and SL4, the third inductor L31d of the notch filter 3b of the DCS system 3 with the strip line electrode SL8. respectively.

Further, the second inductors L21g and L23g of the high frequency switch 4a of the GSM system 4 are formed with the strip line electrodes SL1 and SL3, and the third inductor L31g of the notch filter 4b of the GSM system 4 with the strip line electrode SL5, respectively.

The first capacitor C11 of the diplexer 2 is formed with the capacitor electrodes Cp6 and Cp9, the first capacitor C12 with the capacitor electrodes Cp3 and Cp6, the first capacitor C13 with the capacitor electrode Cp17 and the ground electrode G4, the first capacitor C14 with the capacitor electrodes Cp9 and Cp11, and the first capacitor C15 with the capacitor electrode Cp16 and the ground electrode G4, respectively.

Further, the second capacitor C21d of the high frequency switch 3a of the DCS system 3 is formed with the capacitor electrodes Cp5 and Cp8, the second capacitor C22d with the capacitor electrodes Cp5 and Cp8, the second capacitor C22d with the capacitor electrode Cp13 and the ground electrode G2, respectively. The third capacitor C31d of the notch filter 3b of the DCS system 3 is formed with the capacitor electrodes Cp8 and Cp12, and the third capacitor C32d with the capacitor electrode Cp18 and the ground electrode G4, respectively.

The second capacitor C21g of the high frequency switch 4a of the GSM system 4 is formed with the capacitor electrodes Cp4 and Cp7, and the second capacitor C22g with the capacitor electrode Cp13 and the ground electrode G2, respectively. The third capacitor C31g of the notch filter 4b of the GSM system 4 is formed with the capacitor electrodes Cp7 and Cp10, and the third capacitor C32g with the capacitor electrode Cp15 and the ground electrode G4, respectively.

In the composite high frequency component of the first embodiment, for the purpose of on-off controlling the high frequency switches of the DCS and GSM systems by means of the first common controlling power supply connected to the transmission sides, the high frequency switches of the DCS and GSM systems can be turned on at the same time. Accordingly, the higher harmonic distortion with respect to the high frequency switches during the transmission can be reduced, enhancing the characteristics of the composite high frequency component.

Since the control of the high frequency switches can be simplified, the transmission and reception of the mobile communication device including the composite high frequency component can be simply carried out.

In addition, since only one power supply is used as the first controlling power supply, the wiring and arrangement on a substrate for mounting the composite high frequency component such as a print substrate or the like is simplified. That is, the miniaturization of the mounted board can be realized. In addition, the size of the mobile communication device including the composite high frequency component can be reduced.

When the diplexer, the high frequency switches, and the filters which constitute the composite high frequency component are integrated into the ceramic multi-layer substrate formed by lamination of the plural ceramic sheet layers, the matching and adjustment between the diplexer and the high frequency switches can be easily performed. Accordingly, it is unnecessary to provide a matching circuit for matching and adjusting the diplexer and the high frequency switch. Thus, the miniaturization of the composite high frequency component can be realized. For example, one diplexer, two high frequency switches, and two filters could be so integrated as to have a size of 6.7 mm' 5 mm' 2 mm.

The diplexer is constituted by the first inductors and the first capacitors, each high frequency switch by the diodes, the second inductors, and the second capacitors; and the filter by the third inductors, and the third capacitors, and moreover, they are contained in or mounted onto the ceramic multi-layer substrate, and connected with a connecting means formed inside the ceramic multi-layer substrate. Accordingly, the composite high frequency component can be configured by use of the one ceramic multi-layer substrate, that is, it can be miniaturized. In addition, the loss, caused by the wiring between the elements can be improved. As a result, the loss of the overall composite high frequency component can be reduced.

The wave-length shortening effect enables the reduction of the lengths of the strip lines which function as the inductors. Therefore, the insertion losses of these strip line electrodes can be improved. As a result, the miniaturization and the reduction in loss of the composite high frequency component can be achieved. Simultaneously, the miniaturization and high performance of the mobile communication device including the composite high frequency component can be realized.

Figure 5:
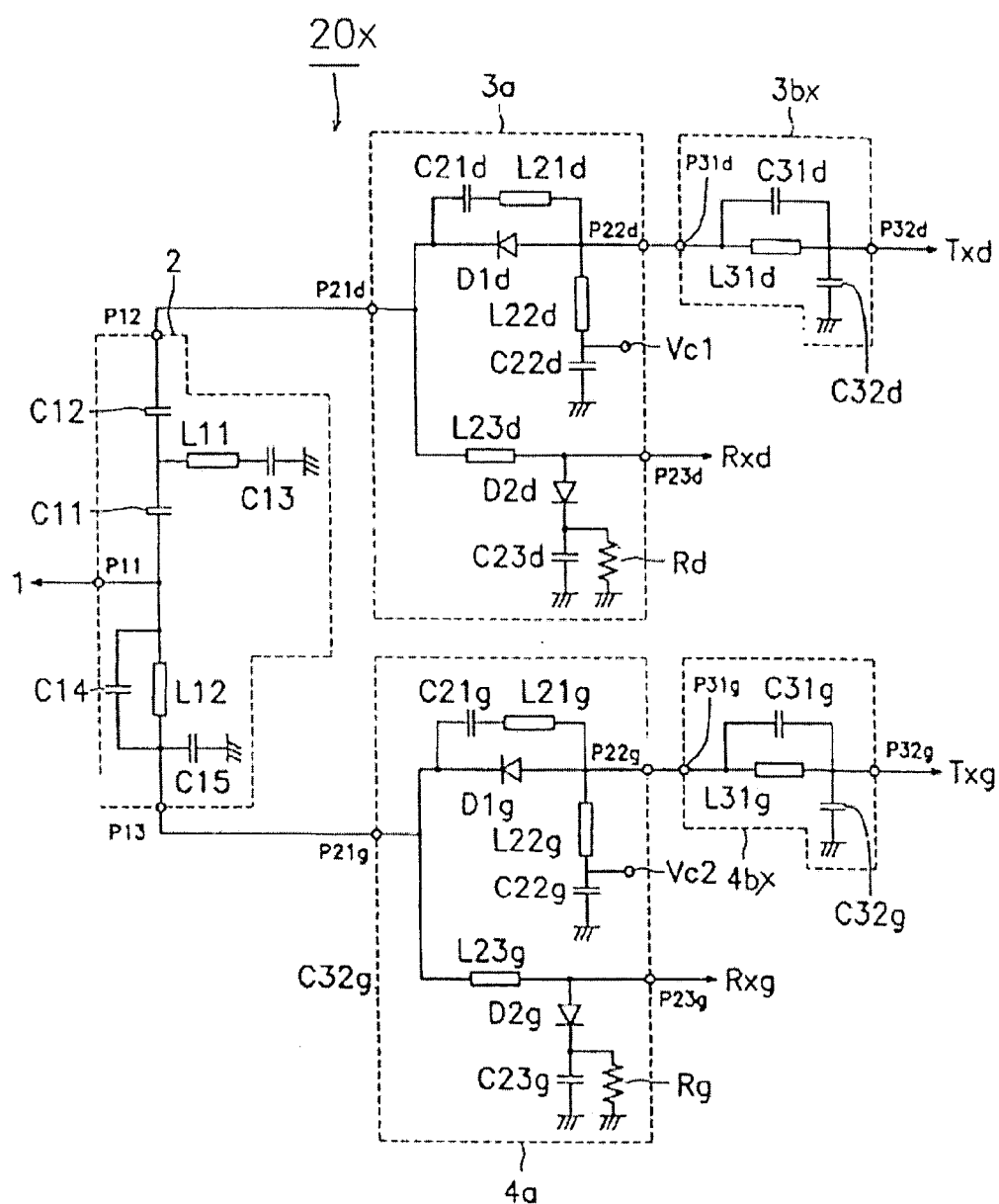
FIG. 5 is a circuit diagram of a mobile communication device including the composite high frequency component according to a second embodiment of the present invention.

FIG. 5 is a circuit diagram of the composite high frequency component according to a second embodiment of the present invention. A composite high frequency component 20x is different from the composite high frequency component 10 of the first embodiment (FIG. 1) in the connection locations of the filter 3bx of the DCS system 3x and the filter 4bx of the GSM system 4x.

More particularly, the filter 3bx of the DCS system 3x is connected to the transmission section Txd side which is in the latter stage with respect to the high frequency switch 3ax, and the filter 4bx of the GSM system 4x to the transmission section side Txg which is in the latter stage with respect to the high frequency switch 4ax, respectively.

In the composite high frequency component of the above described second embodiment, each filter is connected to the transmission section side which is in the latter stage of the high frequency switch, the distortion during the transmission, caused by a high power amplifier provided in the transmission section can be attenuated by means of the filter. Thus, the insertion loss on the reception section side can be improved.

Figure 6:
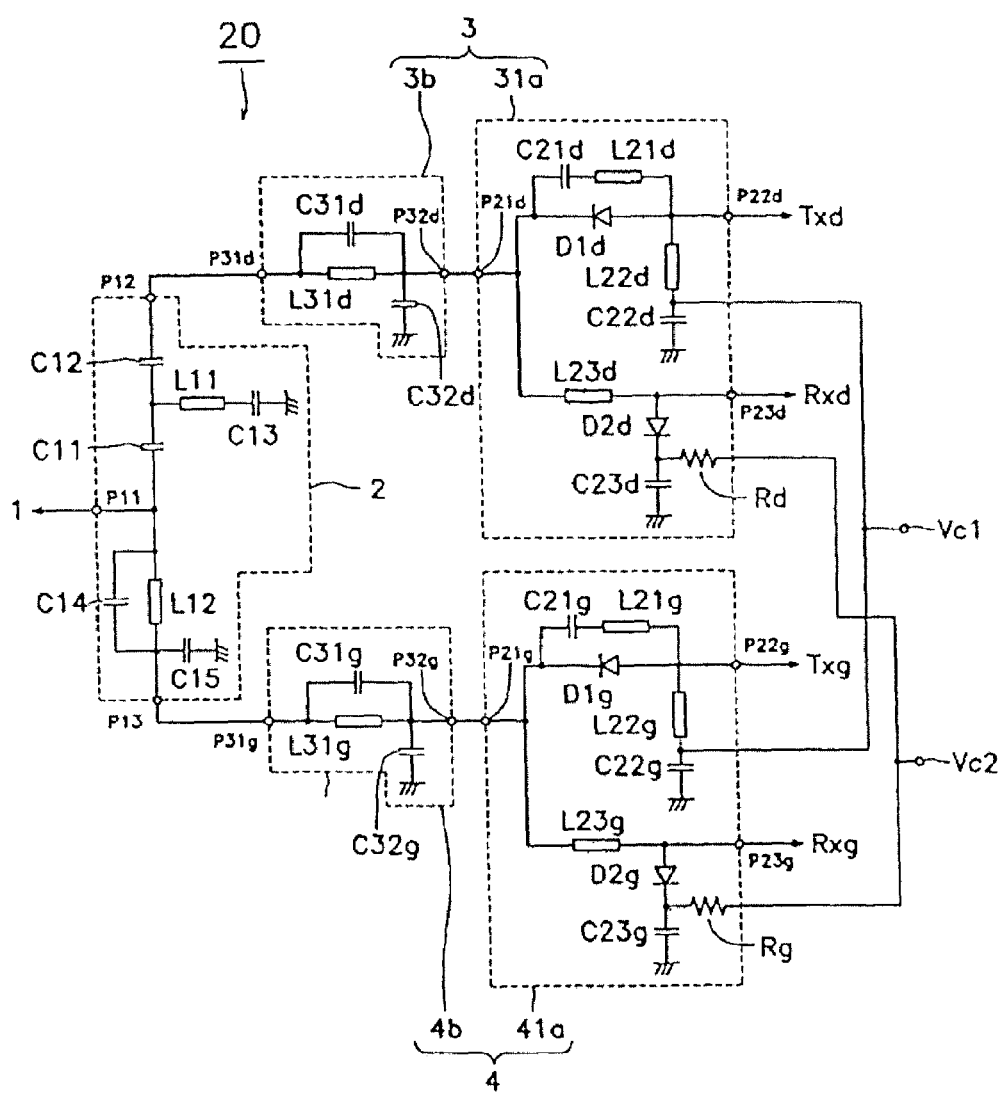
FIG. 6 is a block diagram of a mobile communication device including the composite high frequency component according to a third embodiment of the present invention.

FIG. 6 is a circuit diagram of a third embodiment of the composite high frequency component of the present invention. The composite high frequency component 30 is composed of the diplexer 2, a high frequency switch 31a and the notch filter 3b constituting the DCS system 3, and a high frequency switch 41a and the notch filter 4b constituting the GSM system 4.

The configurations of the diplexer 2, the notch filter 3b of the DCS system 3, and the notch filter 4b of the GSM system 4 are the same as those of the composite high frequency component 10 of the first embodiment of the FIG. 1.

The high frequency switch 31a (41a) is composed of the first and second diodes D1d (D1g) and D2d (D2g) which are first and second switching elements, the second inductors L21d through L23d (L21g through L23g) which are second inductance elements, and the second capacitors C21d through C23d (C21g through C23g) which are second capacitance elements. The second inductor L21d (L21g) is a parallel trap coil, and the second inductor L22d (L22g) is a choke coil.

The first diode D1d (D1g) is so connected between the first port P21d (P21g) and the second port P22d (P22g) that its cathode is on the first port P21d (P21g) side. A series circuit comprising the second inductor L21d (L21g) and the second capacitor C21d (C21g) is connected in parallel to the first diode D1d (D1g).

The second port P22d (P22g) side of the first diode D1d (D1g), namely, its anode is grounded through the second inductor L22d (L22g) and the second capacitor C22d (C22g). The first common controlling power supply Vc1 for controlling the on-off of the high frequency switch 31a (41a) is connected to the node between the second inductor L22d (L22g) and the second capacitor C22d (C22g).

Further, the second inductor L23d (L23g) is connected between the first port P21d (P21g) and the third port P23d (P23g). The second inductor L23d (L23g) on the third port P23d (P23g) side is grounded through the second diode D2d (D2g) and the second capacitor C23d (C23g). To the node between the anode of the second diode D2d (D2g) and the second capacitor C23d (C23g), the second common controlling power supply Vc2 for controlling the on-off of the high frequency switch 31a (41a) is connected through the resistor Rd (Rg).

Hereinafter, the operation of the composite high frequency component 20 having the circuit arrangement shown in FIG. 6 will be now described. First, in the case that a transmitting signal by the DCS system 3 (1.8 GHz band) or by the GSM system 4 (900 MHZ band) is transmitted, a controlling voltage of 3V is applied from the first common controlling power supply Vc1 connected to the high frequency switch 31a of the DCS system 3 and the high frequency switch 41a of the GSM system 4 on the transmission section Txd and Txg sides, and a controlling voltage of 0V is applied from the second common controlling power supply Vc2 connected to the high frequency switch 31a of the DCS system 3 and the high frequency switch 41a of the GSM system 4 on the reception section Rxd and Rxg sides, so that the first and second diodes D1d and D2d of the high frequency switch 31a of the DCS system 3 and the first and second diodes D1g and D2g of the high frequency switch 41a of the GSM system 4 are securely turned on, and thereby, the transmitting signal from the DCS system 3 is passed through the high frequency switch 31a, the notch filter 3b, and the diplexer 2, or the transmitting signal from the GSM system 4 is passed through the high frequency switch 41a, the notch filter 4b, and the diplexer 2, and then, sent through the antenna 1, respectively.

The transmitting signal from the DCS system 3 or the GSM system 4 is fed only to the antenna 1, not to the GSM system 4 or the DCS system 3, correspondingly, by means of the diplexer 2. Further, the second and third harmonics of the DCS system 3 are attenuated in the notch filter 3b of the DCS system 3, while the third harmonics of the GSM system 4 is done in the notch filter 4b of the GSM system 4.

In the case that a receiving signal for the DCS system 3 or the GSM system 4 is received, a controlling voltage of 0V is applied from the first common controlling power supply Vc1 connected to the high frequency switch 31a of the DCS system 3 on the transmission section Txd side and the high frequency switch 41a of the GSM system 4 on the transmission section Txd side, and a controlling voltage of 3V is applied from the second common controlling power supply Vc2 connected to the high frequency switch 31a of the DCS system 3 on the reception section Rxd side and the high frequency switch 41a of the GSM system 4 on the reception section Rxg side, so that the first and second diodes D1d and D2d of the high frequency switch 31a of the DCS system 3 and the first and second diodes D1g and D2g of the high frequency switch 41a of the GSM system 4 are securely turned off, and thereby, the receiving signal for the DCS system 3 is given only to the reception section Rxd of the DCS system 3, while the receiving signal for the GSM system 4 only to the reception section Rxg of the GSM system 4.

The diplexer 2 prevents the receiving signal for the DCS system 3 from being fed to the GSM system 4 and one for the GSM system 4 from being fed to the DCS system 4, respectively.

In the composite high frequency component of the above described third embodiment, the high frequency switches of the DCS and GSM systems are on-off controlled by means of the first common controlling power supply connected to the transmission section sides and the second common controlling power supply connected to the reception section sides. Thus, for transmission, all the first and second diodes of the high frequency switches of the DCS and GSM systems can be securely turned on, and the high frequency switches of the DCS and GSM systems can be securely turned off at the same time. Accordingly, the higher harmonic distortion of the high frequency switches, occurring during the transmission, can be reduced, which enhances the characteristics of the composite high frequency component.

In addition, as the first and the second controlling power supplies, only one power supply is used, respectively. The wiring and arrangement on a substrate for mounting the composite high frequency component such as a printed board or the like is simplified. That is, the miniaturization of the mounting board can be realized. In addition, the miniaturization of the mobile communication device including the composite high frequency component can be realized.

Figure 7:
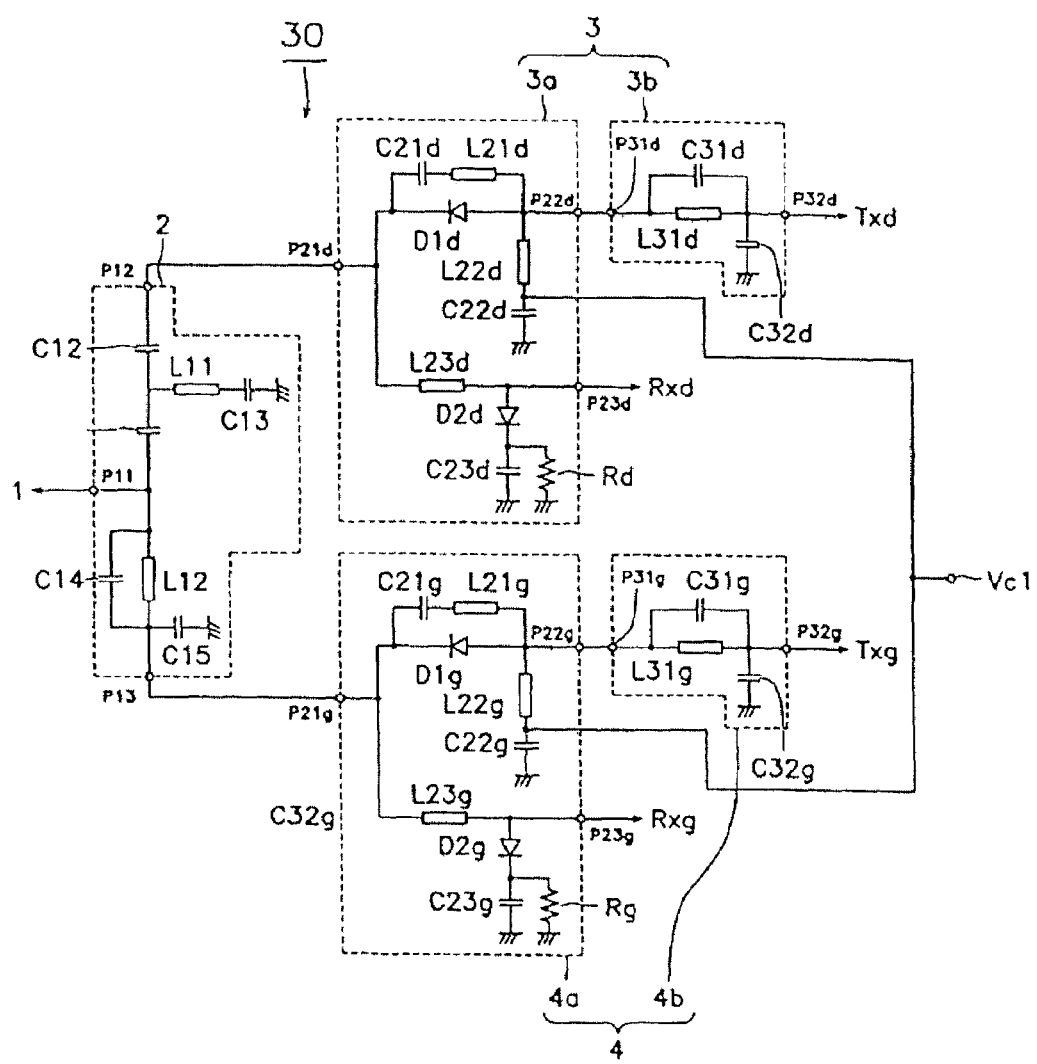
FIG. 7 is a circuit diagram of the composite high frequency component according to a fourth embodiment of the present invention.

FIG. 7 is a circuit diagram of the composite high frequency component according to a fourth embodiment of the present invention. As regards a composite high frequency component 30, the arrangement and location of the notch filter 3b constituting the DCS system 3 and the notch filter 4b constituting the GSM system 4 are different, compared with the composite high frequency component 10 (FIG. 1) of the first embodiment.

More particularly, the notch filter 3b of the DCS system 3 is arranged between the high frequency switch 3a and the transmission section Txd, while the notch filter 4b of the GSM system 4 between the high frequency switch 4a and the transmission section Txg.

In the composite high frequency component of the above described fourth embodiment, since each filter is arranged between the high frequency switch and the transmission section, the distortion with respect to the high power amplifier provided in the transmission section can be reduced by means of the filter. Thus, the insertion loss on the reception section side can be improved.

Figure 8:
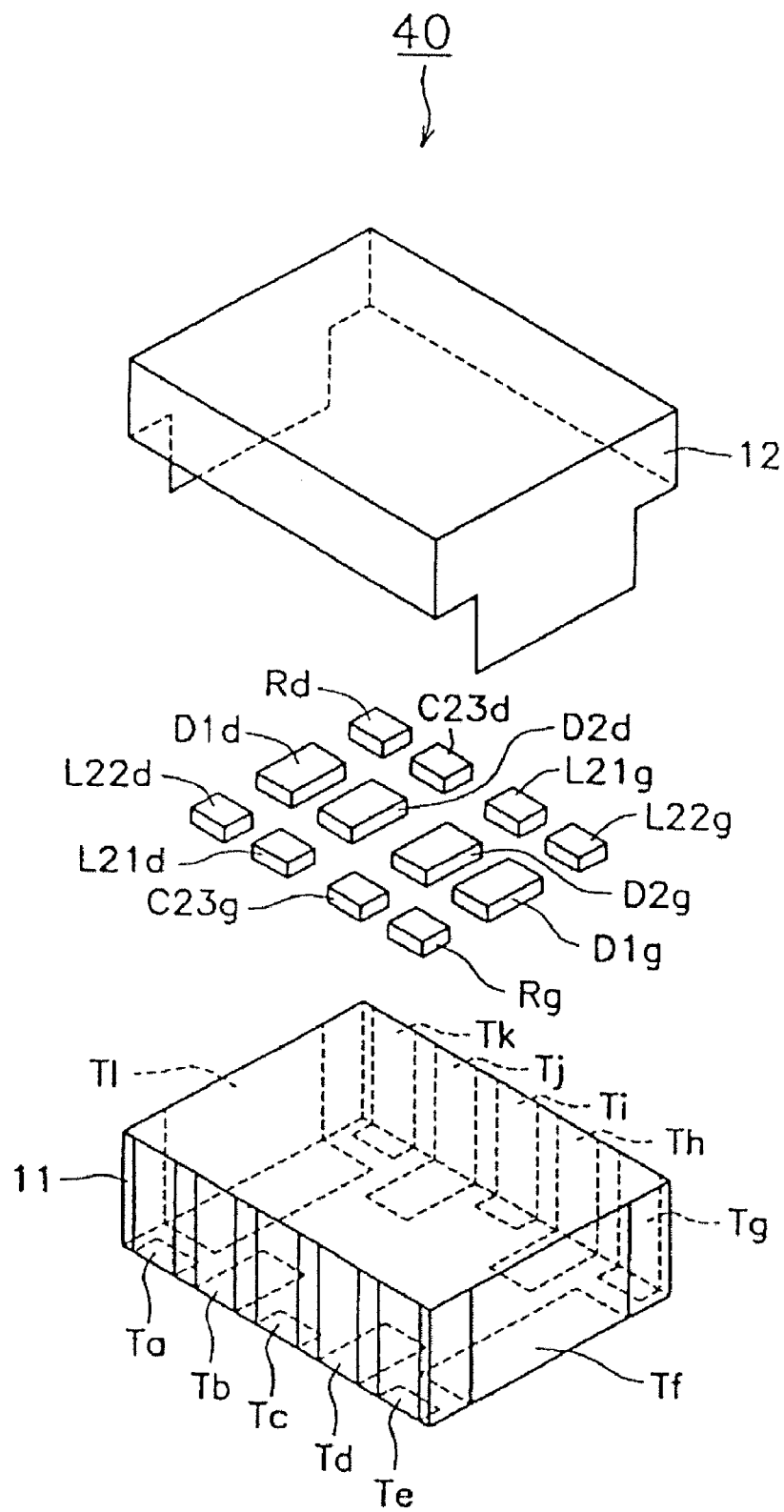
FIG. 8 is an exploded perspective view of an essential part of the composite high frequency component according to a fifth embodiment of the present invention.

FIG. 8 is an exploded perspective view showing the appearance of an essential part of the composite high frequency component according to a fifth embodiment of the present invention. A composite high frequency component 40, as compared with the composite high frequency component 10 (FIG. 1) of the first embodiment, is different in that the parallel trap coils L21d and L21g and the choke coils L22d and L22g, which constitute the high frequency switches 3a and 4a, respectively, are formed of chip coils, which are mounted on the ceramic multi-layer substrate 11.

In the composite high frequency component of the above-described fifth embodiment, the parallel coils and the choke coils of the high frequency switches are formed with the chip coils having a high Q value. Therefore, the chip coils having the same shape and size can be used for plural systems operative in different frequency bands. Thus, the modification of the design, required because of the change of the frequency band, can be easily carried out, and also, it can be performed in a short time. As a result, the manufacturing cost saving can be realized.

Since the Q values of the parallel trap coils and the choke coils are increased, the pass band becomes wider, and the low loss can be realized.

Figure 9:
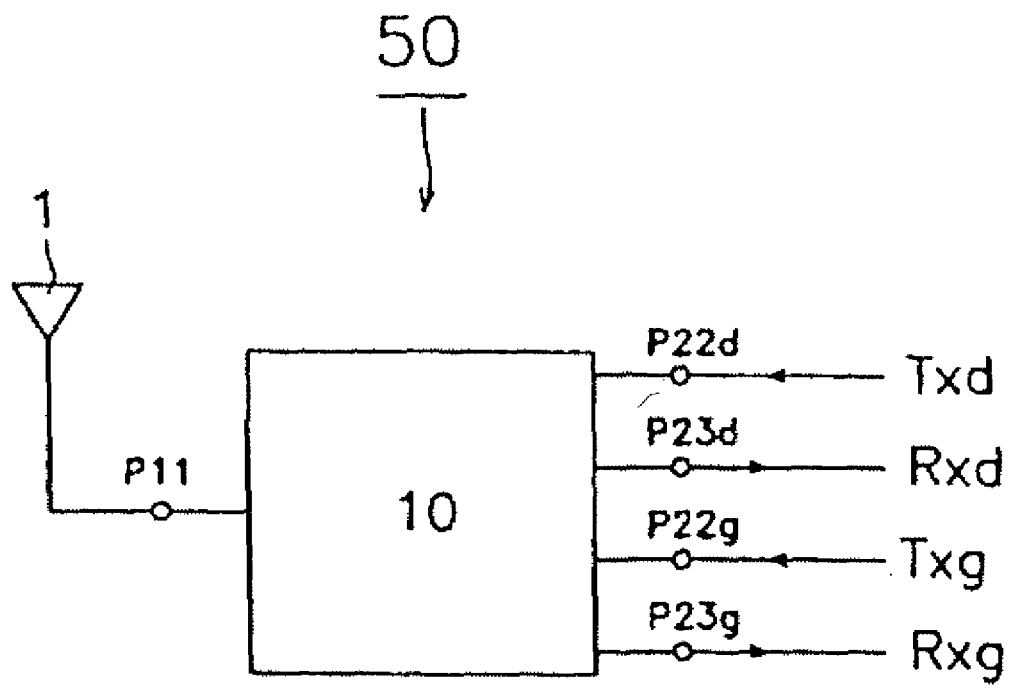
FIG. 9 is a block diagram showing a part of the arrangement of the mobile communication device including the composite high frequency component of FIG. 1.

FIG. 9 is a block diagram showing a part of the configuration of a dual band portable telephone as the mobile communication device, in which the combination of DCS operative in the 1.8 GHz band with GSM in the 900 MHZ band is shown as an example. The dual band portable telephone 50 is equipped with the antenna 1 and the composite high frequency component 10 (FIG. 1).

The antenna 1 is connected to the port P11 of the composite high frequency component 10, and the ports P22d, P23d, P22g, and P23g to the transmission section Txd of the DCS system, the reception section Rxd of the DCS system, the transmission section Txg of the GSM system, and the reception section Rxg of the GSM system, respectively.

The above-described dual band portable telephone includes the composite high frequency component which is small in size and has less high frequency distortion. Thus, the miniaturization and high performance of the mobile communication device having the composite high frequency component mounted thereto can be realized.

In the above first through fifth embodiments of the composite high frequency component, the dual band which is the combination of DCS with GSM has been described. However, the dual band is not limited to the combination of DCS with GSM. For example, the combination of PCS (Personal Communication Services) with AMPS (Advanced Mobile Phone Services), that of DECT (Digital European Cordless Telephone) with GSM, that of PHS (Personal Handy-phone System) with PDC (Personal Digital Cellular), and so forth can be employed.

Further, the case that the signal path consist of the two systems has been described. However, the present invention is advantageous as well in the case that the signal path consists of at least three systems.

Further, the above embodiment of the mobile communication device describes the case that the composite high frequency component of FIG. 1 is employed in the dual band portable telephone which is the mobile communication device. The present invention, which employs the composite high frequency components of FIGS. 5 through 8, respectively, is advantageous as well.

Figure 10:
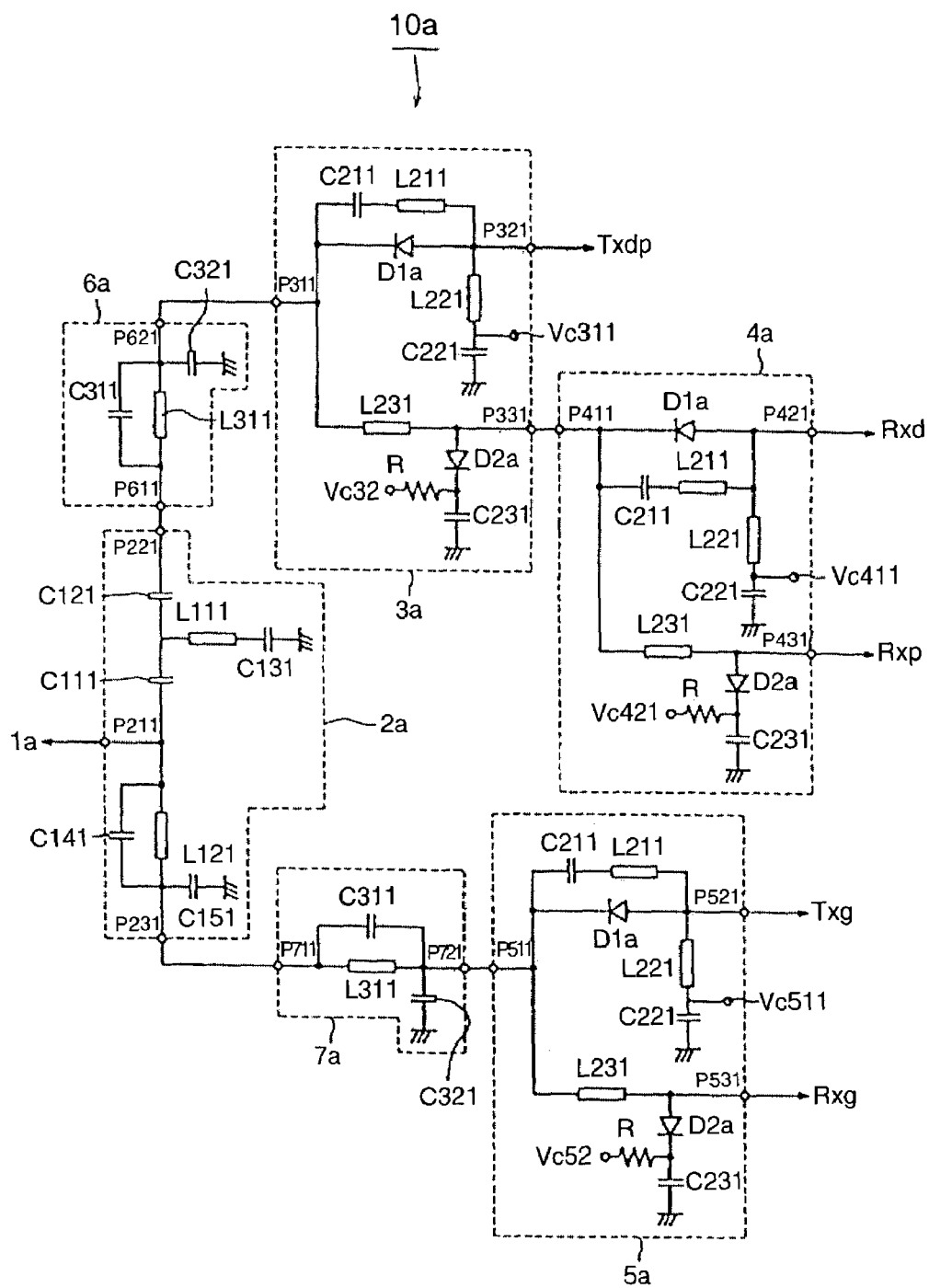
FIG. 10 is a circuit diagram of a composite high frequency component according to a sixth embodiment of the present invention.
Figure 15:
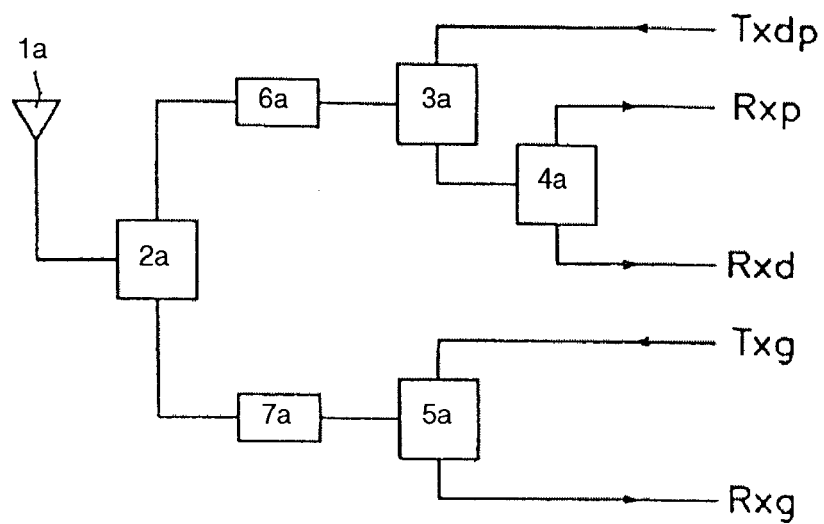
FIG. 15 is a block diagram showing the configuration of the front end portion of a general triple band portable telephone (mobile communication device).

FIG. 10 is a circuit diagram of a sixth embodiment of a composite high frequency component according to the present invention. A composite high frequency component 101 comprises a diplexer 2a shown in the block diagram of FIG. 15, and first through third high frequency switches 3a through 5a, first and second filters 6a and 7a, and constitutes a part of a front end portion corresponding to DCS (1.8 GHz band), PCS (1.8 GHz band), and GSM (900 MHZ band) which are first through third communication systems.

An antenna 1a is connected to the first port P211 of the diplexer 2a, the first port P611 of the first filter 6a to the second port P221, and the first port P711 of the second filter 7a to the third port P231, respectively.

The first port P311 of the first high frequency switch 3a is connected to the second port P621 of the first filter 6a. The transmission section Txdp common to DCS and PCS is connected to the second port P321 of the first high frequency switch 3a, and the first port P411 of the second high frequency switch 4a to the third port P331, respectively.

The reception section Rxd of DCS is connected to the second port P421 of the second high frequency switch 4a, and the reception section Rxp of PCS to the third port P431, respectively.

Further, the first port P51 of the third high frequency switch 5a is connected to the second port P721 of the second filter 7a, the transmission section Txg of GSM to the second port P521 of the third high frequency switch 5a, and the reception section Rxg of GSM to the third port P531, respectively.

The diplexer 2a is formed with first inductors L111 and L121 which are first inductance elements, and first capacitors C111 through C151 which are first capacitance elements.

The first capacitors C111 and C121 are connected in series between the first port P211 and the second port P221, and their node is grounded through the first inductor L111 and the first capacitor C131.

A parallel circuit comprising the first inductor L121 and the first capacitor C141 is connected between the first port P211 and the third port P231. The parallel circuit on the third port P231 side is grounded through the first capacitor C151.

The first high frequency switch 3a comprises first and second diodes D1a and D2a which are first switching elements, second inductors L211 through L231 which are second inductance elements, and second capacitors C211 through C231 which are second capacitance elements.

The first diode D1a is so connected between the first port P311 and the second port P321 that its cathode is on the first port P311 side. A series circuit comprising the second inductor L211 and the second capacitor C211 is connected in parallel to the first diode D1a.

The first diode D1a on the second port P321 side, namely, its anode is grounded through the second inductor L221 and the second capacitor C221. The node between the second inductor L221 and the second capacitor C221 is provided with a first controlling terminal Vc31.

Further, the second inductor L231 is connected between the first port P311 and the third port P331, and the second inductor L231 on the third port P331 side is grounded through the second diode D2a and the second capacitor C231. The node between the cathode of the second diode D2a and the second capacitor C231 is provided with the second controlling terminal Vc32 through the resistor R.

In this case, the second inductor L211 connected in parallel with the first diode D1a is a parallel trap coil, and the second inductor L221 is a choke coil.

The first filter 6a comprises a third inductor L311 which is a third inductance element and third capacitors C311 and C321 which are third capacitance elements.

The third inductor L311 is connected in series between the first port P611 and the second port P621. The third capacitor C311 is connected in parallel to the third inductor L311.

The third inductor L311 on the second port P621 side is grounded through the third capacitor C321.

Each of the second and third high frequency switches 4a and 5a has the same arrangement as the first high frequency switch 3a. The second filter 7 has the same arrangement as the first filter 6a.

Figure 11:
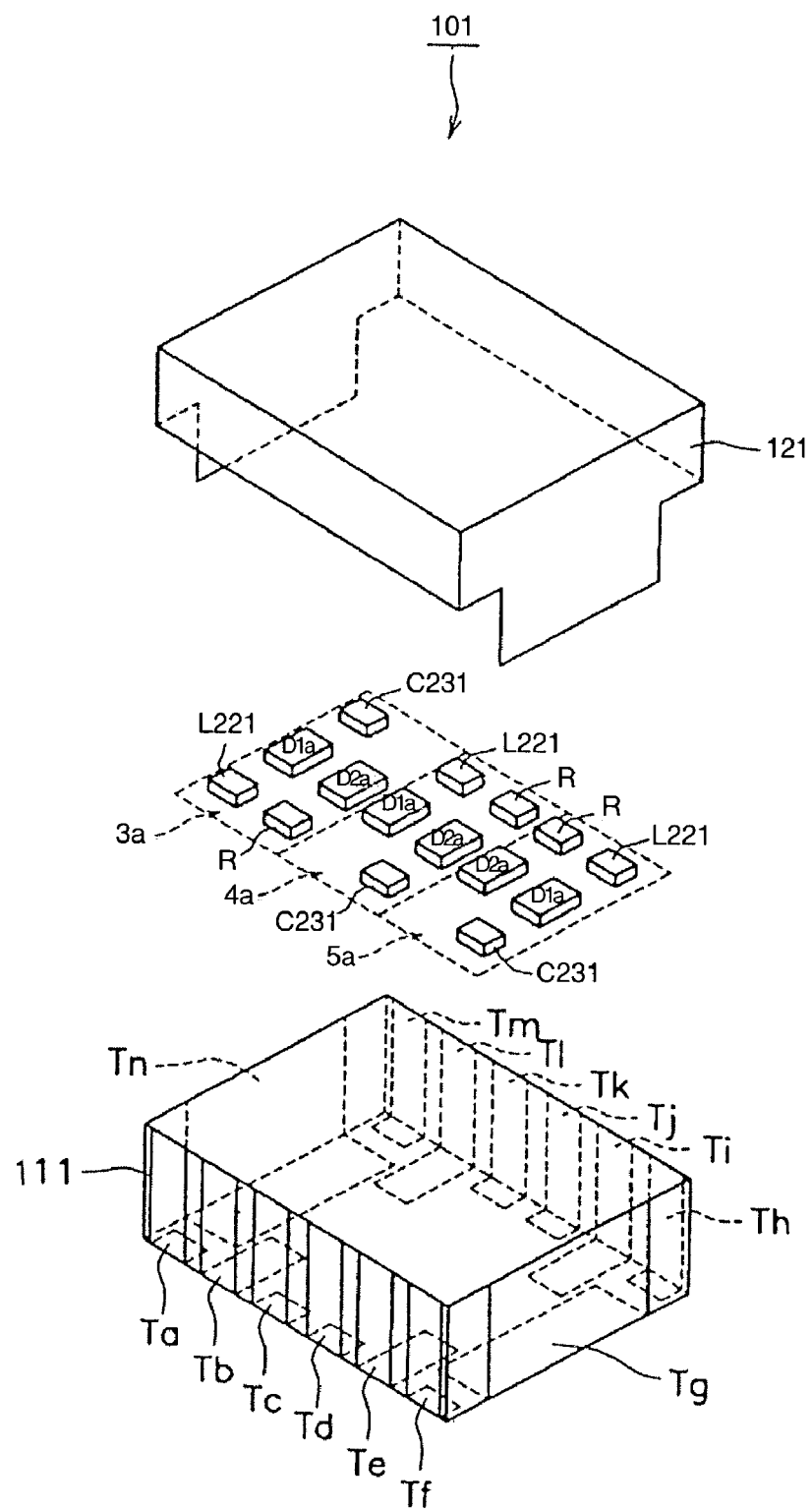
FIG. 11 is an exploded perspective view of an essential part of the composite high frequency component of FIG. 10.

FIG. 11 is an exploded perspective view of an essential part of the composite high frequency component having the circuit arrangement shown in FIG. 10. The composite high frequency component 101 contains a ceramic multi-layer substrate 111. In the ceramic multi-layer substrate 111, though not shown, contained are the first inductors L1 and L121, and the first capacitors C111 through C151 which make up the diplexer 2a, the second inductors L211, L231 and the second capacitors C211 and C221 of the first high frequency switch 3a, the second inductors L211, L231 and the second capacitors C211, C221 of the second high frequency switch 4a, the second inductors L211, L231 and the second capacitors C211, C221 of the third high frequency switch 5a, the third inductor L311 and the third capacitors C311, C321 of the first filter 6a, and the third inductor L311 and the third capacitors C311, C321 of the second filter 7a.

On the surface of the ceramic multi-layer substrate 111, in the form of chip elements, mounted are the first and second diodes D1a and D2a, the second inductor L221 (choke coil), the second capacitors C231, and the resistor R which constitute the first high frequency switch 3a, and the first and second diodes D1a, D2a, the second inductor L221 (choke coil), the second capacitor C231, and the resistor R which constitute the second high frequency switch 5a, and the first and second diodes D1a, D2a, the second inductor L221 (choke coil), the second capacitor C231 and the resistor R which constitute the third high frequency switch 5a.

Further, fourteen external terminals Ta through Tn are so formed as to elongate from the side face onto the bottom of the ceramic multi-layer substrate 111 by screen printing or the like, respectively. Of the external terminals Ta through Tn, the six external terminals Ta through Tf are formed on one long-side side of the ceramic multi-layer substrate 111, the six external terminals Th through Tm on the other long-side side of the ceramic multi-layer substrate 111, and the remaining two external terminals Tg and Tn on the opposite short-side sides of the ceramic multi-layer substrate 111, respectively, by screen printing or the like.

The external terminals Ta through Tn function as the first port P211 of the diplexer 2a, the second port P321 of the first high frequency switch 3a, the second and third ports P42, P43, P52, P53 of the second and third high frequency switches 4a and 5a, and the first and second controlling terminals Vc311,Vc321. Vc411, Vc421, Vc511, Vc521 and the ground terminals of the first through third high frequency switches 3a through 5a.

Further, the ceramic multi-layer substrate 111 is covered with a metal cap 121 so as to coat the surface of the ceramic multi-layer substrate 111. In this case, the metal cap and the external terminals Tg and Tn which are formed on the respective opposite short-side sides of the ceramic multi-layer substrate 11 and function as a ground terminal.

The operation of the composite high frequency component 101 having the circuit arrangement shown in FIG. 10 will be now described. First, if a transmitting signal by DCS or PCS (1.8 GHz band) is transmitted, 1V is applied to the first controlling terminal Vc 311, and 0V to the second controlling terminal Vc 321, respectively, in the first high frequency switch 3a, so that the first port P311 and the second port P321 of the first high frequency switch 3a are connected, and thereby, the transmitting signal by DCS or PCS is passed through the first high frequency switch 3a, the first filter 6a, and the diplexer 2a, and sent through the antenna 1a. In this case, the first filter 6a allows the transmitting signal by DCS, PCS to pass therethrough and attenuates the second and third harmonics.

In the second and third high frequency switches 4a and 5a, 0V is applied to the first controlling terminals Vc 411 and Vc 511, and 1V to the second controlling terminals Vc 42 and Vc 52, so that the second and third high frequency switches 4a and 5a are cut off.

Further, in the case that a transmitting signal by GSM (900 MHZ band) is transmitted, 1V is applied to the first controlling terminal Vc 511 and 0V to the second controlling terminal Vc521, respectively, in the third high frequency switch 5a, so that the first port P511 and second port P521 of the third high frequency switch 5a are connected, and thereby, the transmitting signal by GSM is passed through the third high frequency switch 5a, the second filter 7a, and the diplexer 2a, and sent through the antenna 1a. In this case, the second filter 7a allows the transmitting signal by GSM to pass and attenuates the third harmonics.

In the first and second high frequency switches 3a and 4a, 0V is applied to the first controlling terminals Vc311 and Vc 411, and 1V to the second controlling terminals Vc321 and Vc421, so that the first and second high frequency switches 3a and 4a are cut off, respectively.

Further, in the case that a receiving signal by DCS is received, 0V is applied to the first controlling terminal Vc311, and 1V to the second controlling terminal Vc321, respectively, in the first high frequency switch 3a, so that the first port P311 and the third port P331 of the first high frequency switch 3a are connected. In the second high frequency switch 4a, 0V is applied to the first controlling terminal Vc411, and 1V to the second controlling voltage Vc421, so that the first port P411 and the third port P431 of the second high frequency switch 4a are connected, and thereby, the receiving signal by DCS received through the antenna 1a is passed through the diplexer 2a, the first filter 6a, and the first and second high frequency switches 3a and 4a, and fed to the reception section Rxd of DCS. In this case, the first filter 6a allows the receiving signal by DCS to pass and attenuates the second and third harmonics.

In the third high frequency switch 5a, 0V is applied to the first controlling terminal Vc511, and 1V to the second controlling terminal Vc521, respectively, so that the third high frequency switch 5a is cut off.

Further, in the case that the receiving signal by PCS is received, 0V is applied to the first controlling terminal Vc311 and 1V to the second controlling terminal Vc321, respectively, in the first high frequency switch 3a, so that the first port P311 and the third port P331 of the first high frequency switch 3a are connected, and in the second high frequency switch 4a, 1V is applied to the first controlling terminal Vc411, and 0V to the second controlling terminal Vc421, respectively, so that the first port P411 and the second port P421 of the second high frequency switch 4a are connected, and thereby, the receiving signal by PCS received through the antenna 1a is passed through the diplexer 2a, the first filter 6a, and the first and second high frequency switches 3a and 4a, and fed to the reception section Rxp of PCS. In this case, the first filter 6a allows the receiving signal by PCS to pass and attenuates the second and third harmonics.

In the third high frequency switch 5a, 0V is applied to the first controlling terminal Vc511, and 1V to the second controlling terminal Vc521, respectively, so that the third high frequency switch 5a is cut off.

In the case that a receiving signal by GSM, 0V is applied to the first controlling terminal Vc511, and 1V to the second controlling terminal Vc521, respectively, in the third high frequency switch 5a, so that the first port P511 and the third port P531 of the third high frequency switch 5a are connected, and thereby, the receiving signal for GSM, received through the antenna 1, is passed through the diplexer 2a, the second filter 7a, and the third high frequency switch 5a, and fed to the reception section Rxg of GSM. In this case, the second filter 7a allows the receiving signal by GSM to pass, and attenuates the third harmonics.

In the first and second high frequency switches 3a and 4a, 0V is applied to the first controlling terminals Vc 311 and Vc411, and 1V to the second controlling terminals Vc321 and Vc421, respectively, so that the first and second high frequency switches 3a and 4a are cut off.

In the composite high frequency component of the sixth embodiment, the diplexer, the first through third high frequency switches, and the first and second filters, which constitute the composite high frequency component, are integrated into the ceramic multi-layer substrate formed by lamination of plural ceramic sheet layers. Thus, the matching, attenuation, and isolation characteristics of the respective elements can be assured, and thereby, it is unnecessary to provide a matching network between the diplexer and the first through third high frequency switches.

Accordingly, the composite high frequency component can be miniaturized. For example, the diplexer, the first through third high frequency switches, and the first and second filters can be integrated into the ceramic multi-layer substrate with a size of 6.3 mm' 5 mm' 2 mm.

Further, the diplexer comprises the first inductors and the first capacitors. Each of the first through third high frequency switches comprises the first and second diodes, the second inductors, and the second capacitors. Each of the first and second filters comprises the third inductor and the third capacitors. They are contained in or mounted onto the ceramic multi-layer substrate, and connected by use of a connecting means formed inside the ceramic multi-layer substrate. Thus, the composite high frequency component can be formed on one ceramic multi-layer substrate, and can be miniaturized. In addition, the loss caused by wiring between its elements can be improved. As a result, the overall loss of the composite high frequency component can be reduced.

Further, with the wavelength shortening effect, the lengths of the strip-line electrodes, which function as the inductors, can be shortened. Thus, the insertion loss, caused by these strip-line electrodes, can be improved. As a result, the miniaturization and low loss of the composite high frequency component can be realized. Accordingly, the miniaturization and high qualities of the mobile communication device including the composite high frequency component can be simultaneously attained.

Figure 12:
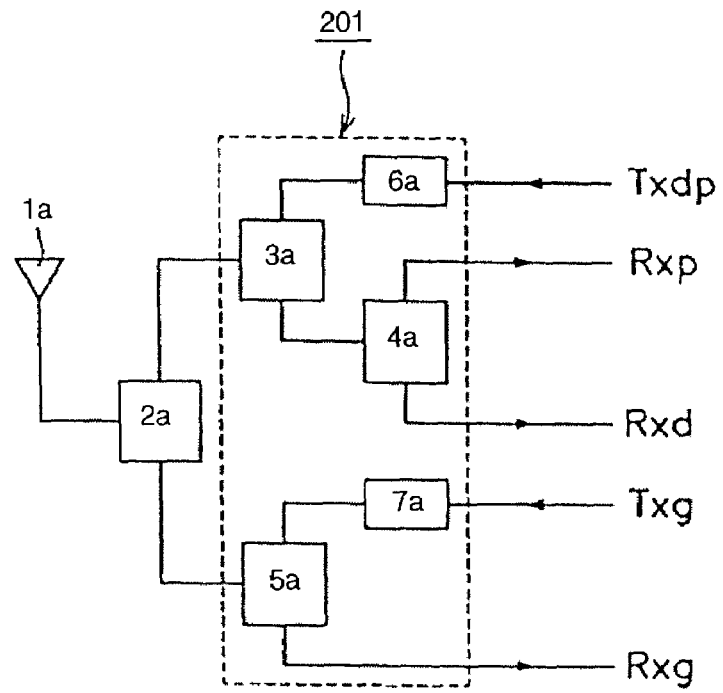
FIG. 12 is a circuit diagram of the composite high frequency component according to a seventh embodiment of the present invention.

FIG. 12 is a block diagram of the composite high frequency component according to a seventh embodiment of the present invention. The composite high frequency component 201 is different from the composite high frequency component 101 of the sixth embodiment (FIG. 10) in the arrangement locations of the first and second filters 6a and 7a.

That is, the first filter 6a is arranged between the first high frequency switch 3a and the transmission section Txdp common to DCS and PCS, and the second filter 7a between the third high frequency switch 4a and the transmission section Txg of GSM.

In the above-described composite high frequency component of the seventh embodiment, since the filters are arranged between the high frequency switches and the transmission sections, respectively. Thus, in transmission, distortions, caused by high-power amplifiers provided in the transmission sections can be reduced by means of the filters, respectively. Thus, an insertion loss on the receiving side can be improved.

Figure 13:
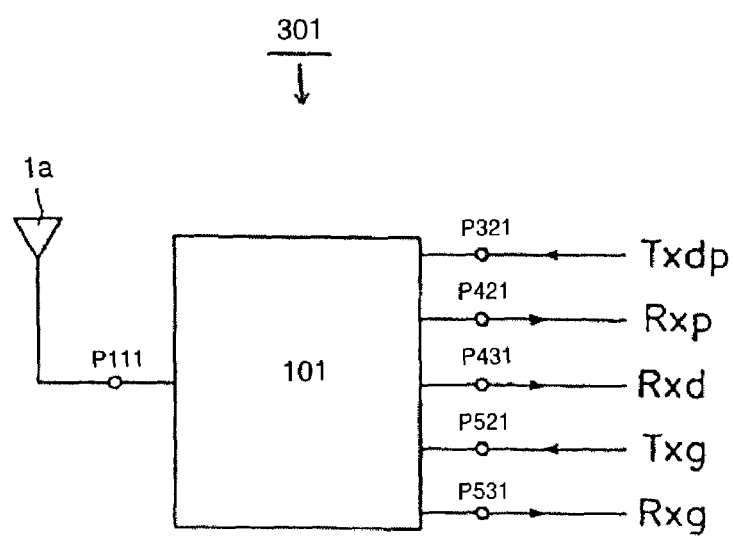
FIG. 13 is a block diagram showing a part of the configuration of a mobile communication device employing the composite high frequency component of FIG. 10.
Figure 14:
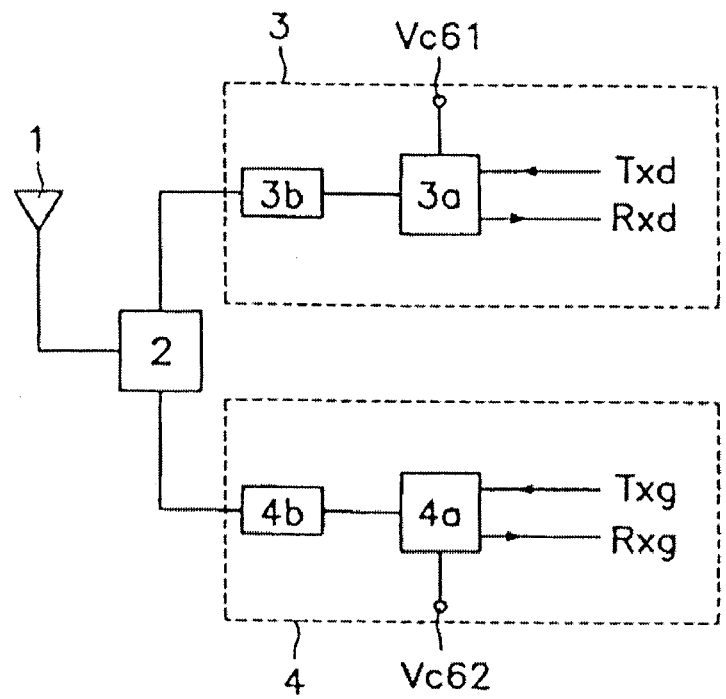
FIG. 14 is a block diagram showing a part of the arrangement of a general dual band portable telephone (mobile communication device).

FIG. 13 is a block diagram showing a part of the configuration of a triple band portable telephone which is one of mobile communication devices, illustrating, as an example, a combination of DCS with PCS operative in the 1.8 GHz band and GSM in the 900 MHZ band. The triple band portable telephone 301 is provided with the antenna 1a and the composite high frequency component 101 (FIG. 10).

The antenna 1a is connected to the port P111 of the composite high frequency component 101, the transmission section Txdp common to DCS and PCS, the reception section Rxp of PCS, the reception section Rxd of DCS, the transmission section Txg of GSM, and the reception section Rxg of GSM to the ports P321, P421, P431, P521, and P531, respectively.

The above-described triple band portable telephone employs the composite high frequency component which is small in size and has a low loss. Thus, the mobile communication device having the composite high frequency component mounted thereon can be miniaturized and rendered high qualities.

If the composite high frequency components 201 (FIG. 12) is employed instead of the composite high frequency component 101, similar effects can be obtained.

While the invention has been particularly shown and described with reference to preferred embodiments thereof, it will be understood by those skilled in the art that the forgoing and other changes in form and details may be made therein without departing from the spirit of the invention.

What is claimed is:

1. A composite high frequency component constituting a part of a microwave circuit having plural signal paths corresponding to their respective frequencies, comprising:

a diplexer including first, second, and third ports, first inductance elements and first capacitance elements for coupling transmitting signals from the plural signal paths for transmission and distributing receiving signals into said plural signal paths for reception;

plural high frequency switches each including first, second, and third ports, a first switching element, a second switching element, second inductance elements, and second capacitance elements for separating the plural signal paths into a transmission section and a reception section, respectively; and plural filters each including first and second ports, a third inductance element, and third capacitance elements introduced in the signal paths; wherein the first port of the diplexer is connected to an antenna port;

each of the second and third ports of the diplexer is connected to the first port of at least one of the plural high frequency switches;

the second port of each of the plural high frequency switches is connected to a transmission section;

the third port of each of the plural high frequency switches is connected to a reception section;

each of the plural filters is connected to one of the first and second ports of a respective one of the plural high frequency switches;

the first switching element of each of the plural high frequency switches is arranged at a second port side of a respective one of the plural high frequency switches;

the second switching element of each of the plural high frequency switches is arranged at a third port side of a respective one of the plural high frequency switches; and said plural high frequency switches being on-off controllable with a first common controlling power supply connected to the plural high frequency switches on the transmission section sides thereof.

2. The composite high frequency component according to claim 1, wherein the plural filters are arranged between the plural high frequency switches and the transmission section sides, respectively.

3. The composite high frequency component according to claim 1, wherein the diplexer, the plural high frequency switches, and the filters are integrated into a ceramic multi-layer substrate composed of plural ceramic sheet layers laminated together.

4. A mobile communication device including the composite high frequency component according to claim 1.

5. A composite high frequency component constituting a part of a microwave circuit having plural signal paths corresponding to their respective frequencies, comprising:

a diplexer including first, second, and third ports, first inductance elements, and first capacitance elements for coupling transmission signals from the plural signal paths for transmission and distributing receiving signals into said plural signal paths for reception;

plural high frequency switches including first, second, and third ports, a first switching element, a second switching element, second inductance elements, and second capacitance elements for separating the plural signal paths into a transmission section and a reception section, respectively; and plural filters including first and second ports, a third inductance element and third capacitance elements and introduced in the signal paths; wherein the first port of the diplexer is connected to an antenna port;

each of the second and third ports of the diplexer is connected to the first port of at least one of the plural high frequency switches;

the second port of each of the plural high frequency switches is connected to a transmission section;

the third port of each of the plural high frequency switches is connected to a reception section;

each of the plural filters is connected to one of the first and second ports of a respective one of the plural high frequency switches;

the first switching element of each of the plural high frequency switches is arranged at a second port side of a respective one of the plural high frequency switches;

the second switch element of each of the plural high frequency switches is arranged at a third port side of a respective one of the plural high frequency switches; and said plural high frequency switches being on-off controllable with a first common controlling power supply connected to the plural high frequency switches on the transmission section sides thereof and a second common controlling power supply connected to the high frequency switches on the reception section sides thereof.

6. The composite high frequency component according to claim 5, wherein the plural filters are arranged between the plural high frequency switches and the transmission section sides, respectively.

7. The composite high frequency component according to claim 5, wherein the diplexer, the plural high frequency switches, and the filters are integrated into a ceramic multi-layer substrate composed of plural ceramic sheet layers laminated together.

8. The composite high frequency component according to claim 7, wherein the first switching elements and the second switching elements, the first through third inductance elements, and the first through third capacitance elements are contained in or mounted onto the ceramic multi-layer substrate and connected by means of a connecting means formed inside the ceramic multi-layer substrate.

9. The composite high frequency component according to claim 8, wherein the second inductance element constituting each of the plural high frequency switches is formed of a choke coil, and the choke coil is integrated into the ceramic multi-layer substrate.

10. A mobile communication device including the composite high frequency component according to claim 5.

* * * * *